(12) United States Patent
Toda

(10) Patent No.: US 12,140,787 B2
(45) Date of Patent: Nov. 12, 2024

(54) RESONATOR STRUCTURE, IMAGING ELEMENT, AND ELECTRONIC APPARATUS

(71) Applicant: SONY SEMICONDUCTOR SOLUTIONS CORPORATION, Kanagawa (JP)

(72) Inventor: Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 729 days.

(21) Appl. No.: 17/055,682

(22) PCT Filed: May 14, 2019

(86) PCT No.: PCT/JP2019/019074
§ 371 (c)(1),
(2) Date: Nov. 16, 2020

(87) PCT Pub. No.: WO2019/221104
PCT Pub. Date: Nov. 21, 2019

(65) Prior Publication Data
US 2021/0191019 A1    Jun. 24, 2021

(30) Foreign Application Priority Data

May 18, 2018   (JP) .................... 2018-096234

(51) Int. Cl.
*G02B 5/28*  (2006.01)
*H01L 27/146*  (2006.01)

(52) U.S. Cl.
CPC ........ *G02B 5/288* (2013.01); *H01L 27/14623* (2013.01); *H01L 27/14627* (2013.01)

(58) Field of Classification Search
CPC ..................................................... G02B 5/288
See application file for complete search history.

(56) References Cited

U.S. PATENT DOCUMENTS 4,158,133 A  *  6/1979  Spaeth ................. G02B 5/288
                                              257/432
5,914,804 A  *  6/1999  Goossen ............... G02B 26/02
                                              359/291

(Continued)

FOREIGN PATENT DOCUMENTS

CN       1828345 A     9/2006
CN     102262253 A    11/2011

(Continued)

OTHER PUBLICATIONS

International Search Report and Written Opinion of PCT Application No. PCT/JP2019/019074, issued on Aug. 20, 2019, 08 pages of ISRWO.

*Primary Examiner* — Peter M Albrecht
(74) *Attorney, Agent, or Firm* — CHIP LAW GROUP

(57) ABSTRACT

There is provided a resonator structure that obtains a highly accurate optical spectrum. The resonator structure includes a stacked structure that includes a semiconductor layer, a first resonator, a first reflection layer, a second resonator, a second reflection layer stacked in this order, allows light of a specific wavelength band to be transmitted therethrough, the semiconductor layer having a first average refractive index, the first resonator having a second average refractive index lower than the first average refractive index, and the first reflection layer having a third average refractive index higher than the second average refractive index.

12 Claims, 24 Drawing Sheets

(56) References Cited

U.S. PATENT DOCUMENTS

| | | | |
|---|---|---|---|
| 7,521,666 B2 * | 4/2009 | Tsang | G02B 5/288 |
| | | | 250/226 |
| 2006/0198025 A1 | 9/2006 | Chen | |
| 2010/0096011 A1 * | 4/2010 | Griffiths | G02B 5/288 |
| | | | 136/257 |
| 2011/0290982 A1 | 12/2011 | Boutami et al. | |
| 2015/0206912 A1 | 7/2015 | Kanamori et al. | |
| 2017/0059754 A1 * | 3/2017 | Frey | G02B 5/288 |
| 2018/0372546 A1 | 12/2018 | Enichlmair et al. | |

FOREIGN PATENT DOCUMENTS

| | | |
|---|---|---|
| CN | 108780006 A | 11/2018 |
| EP | 2390689 A1 | 11/2011 |
| EP | 3182079 A1 | 6/2017 |
| FR | 2960654 A1 | 12/2011 |
| JP | 2006-351800 A | 12/2006 |
| JP | 2011-248350 A | 12/2011 |
| JP | 2019-508667 A | 3/2019 |
| KR | 10-2011-0130341 A | 12/2011 |
| KR | 10-2018-0082508 A | 7/2018 |
| WO | 2012/004934 A1 | 1/2012 |
| WO | 2015/015722 A1 | 2/2015 |
| WO | 2017/102312 A1 | 6/2017 |

* cited by examiner

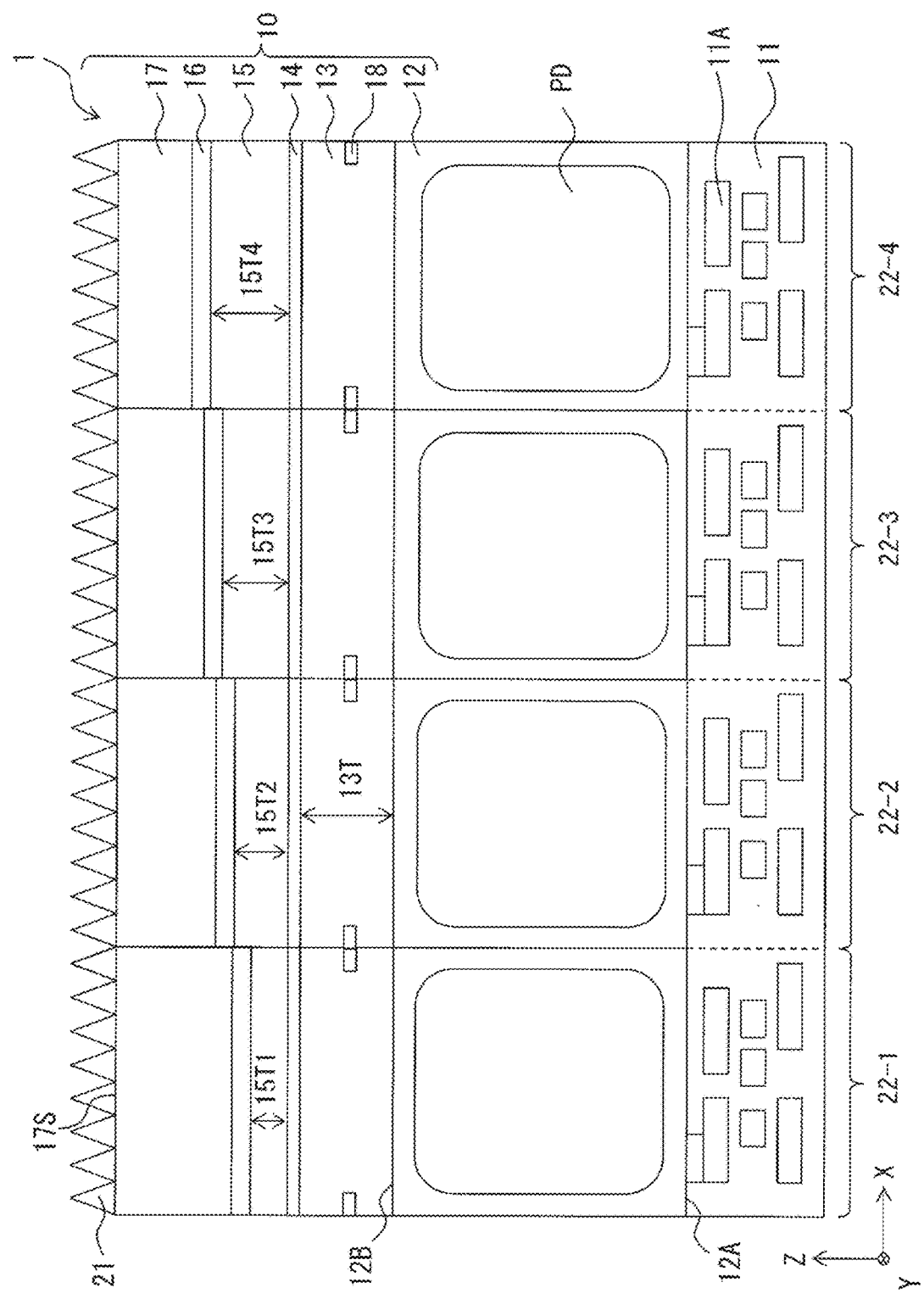
[FIG. 1]

[FIG. 2]
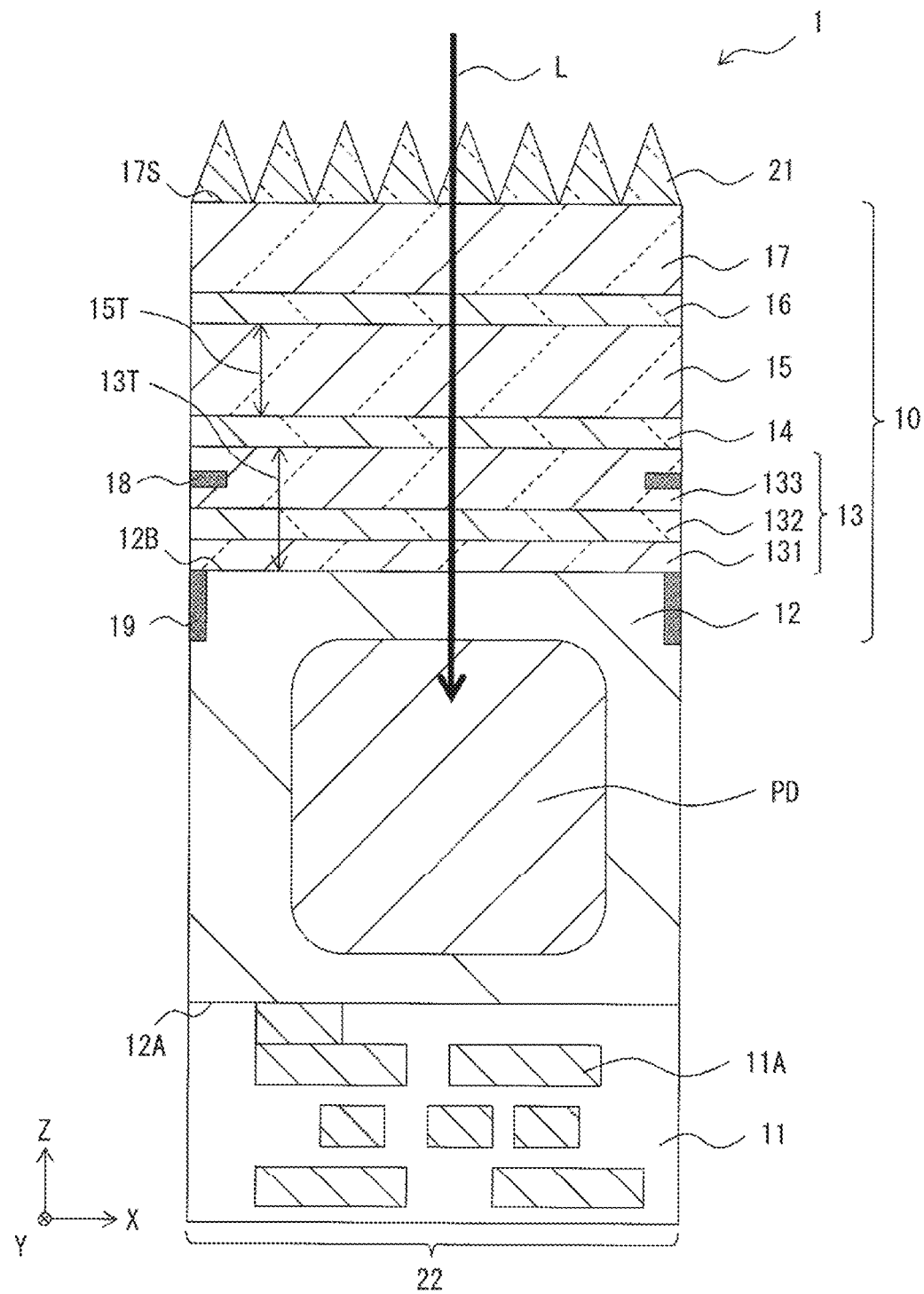

[FIG. 3]

[FIG. 4A]
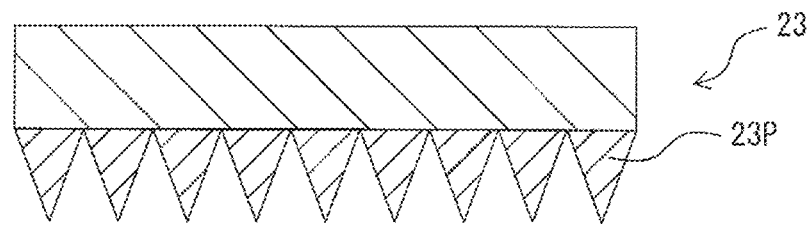
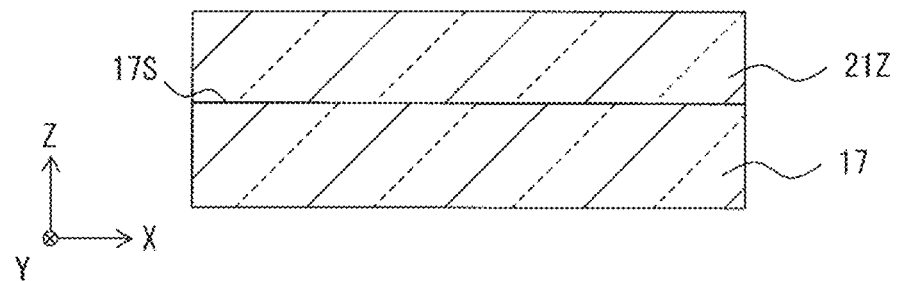
[FIG. 4B]
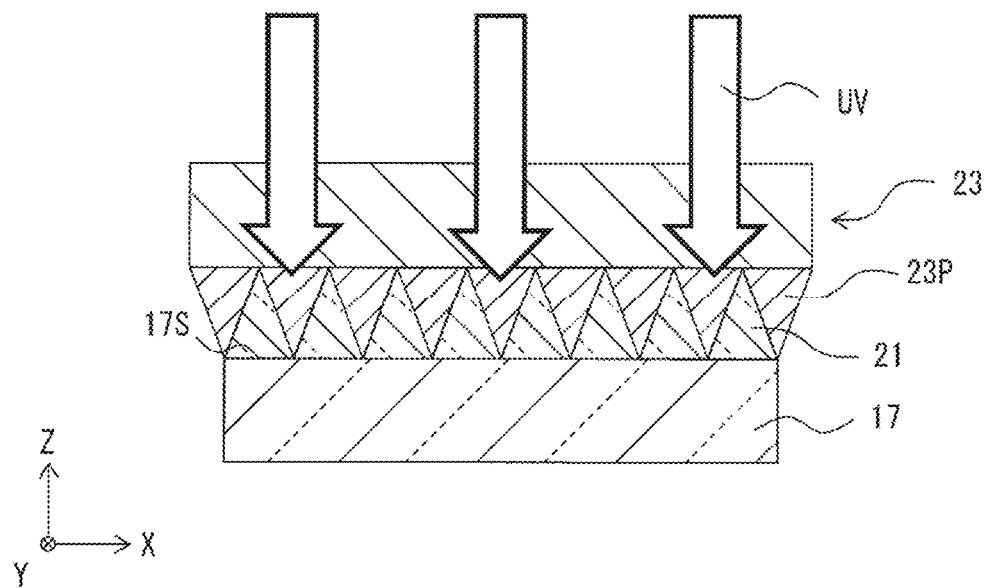

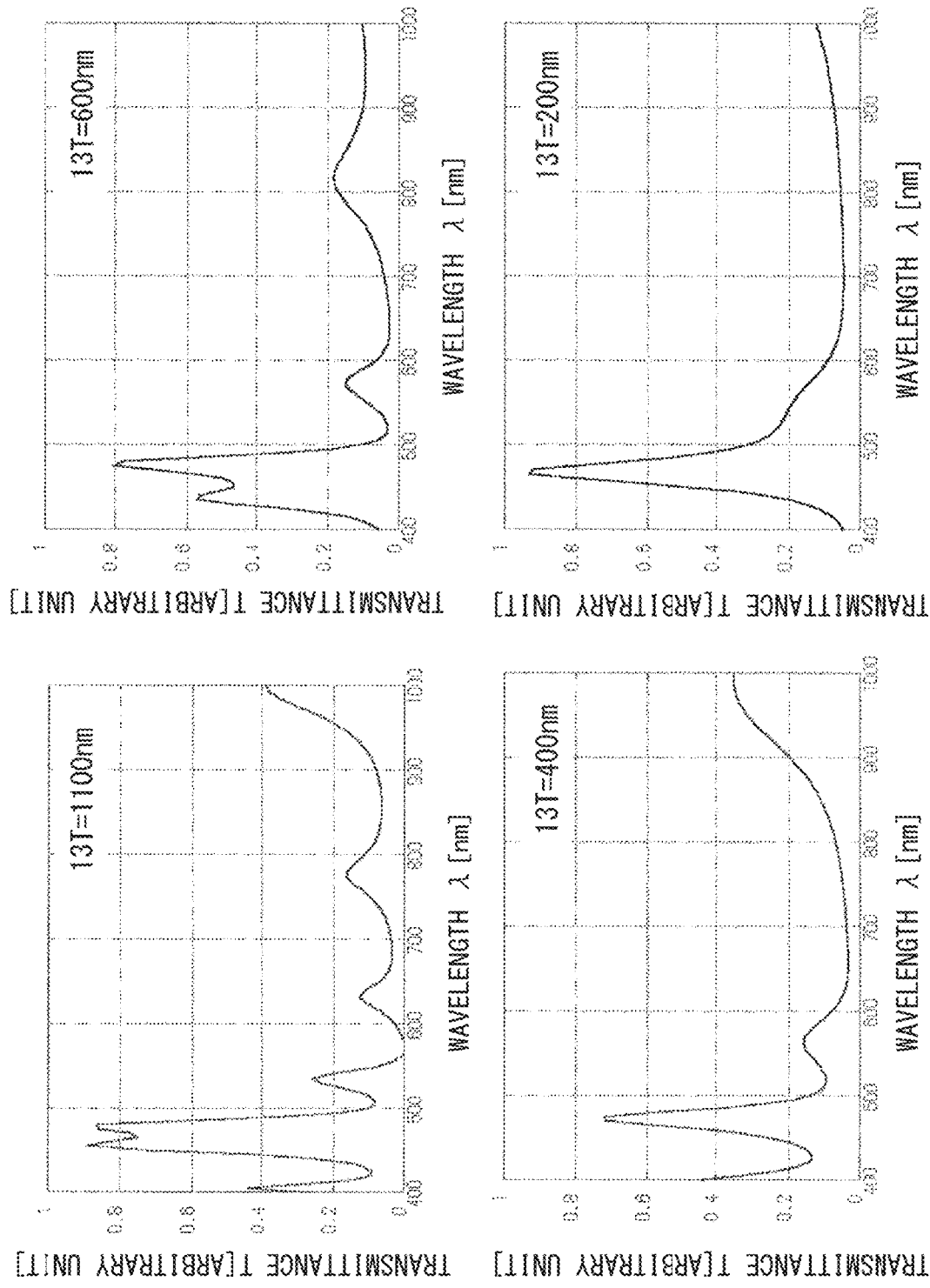
[FIG. 5]

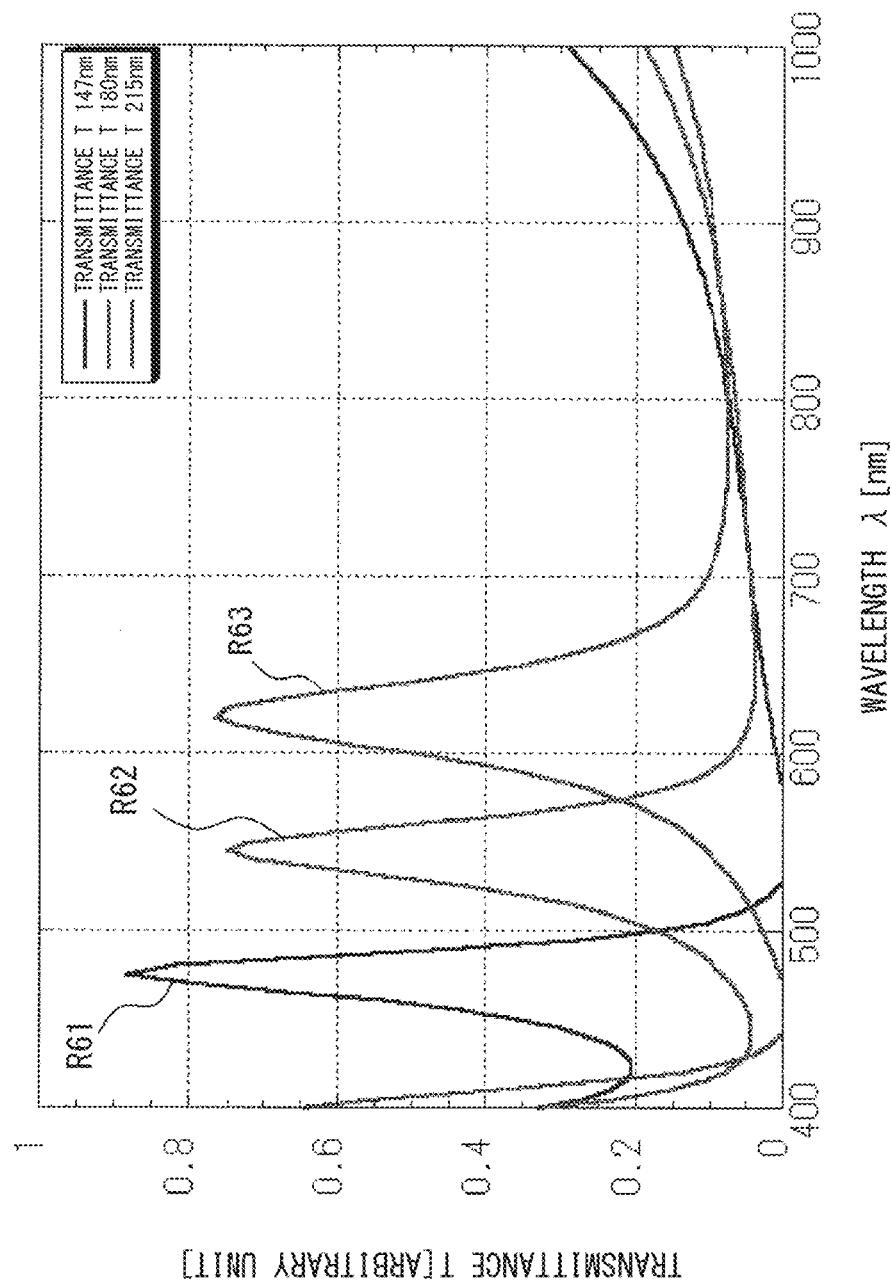
[FIG. 6]

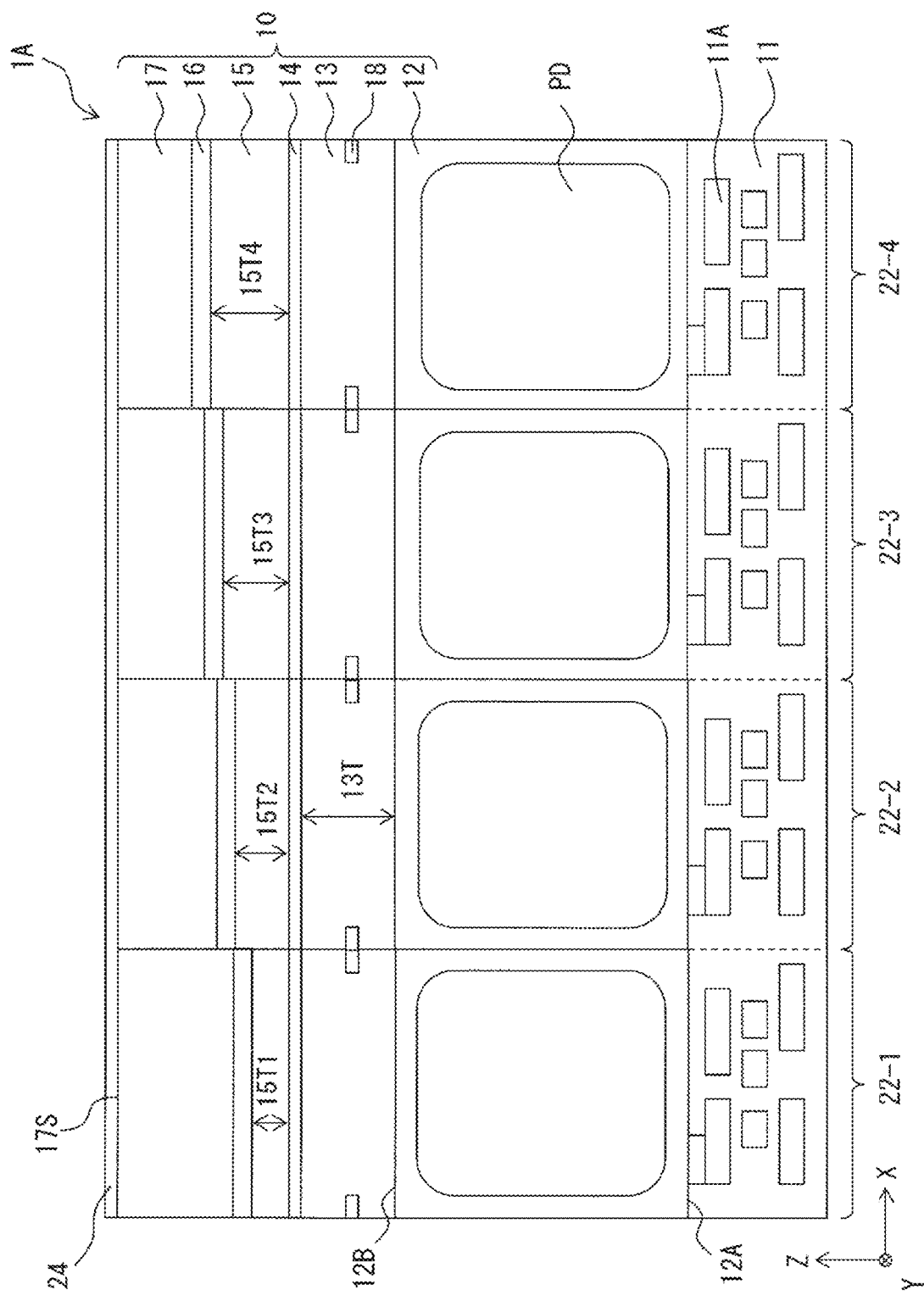
[FIG. 7]

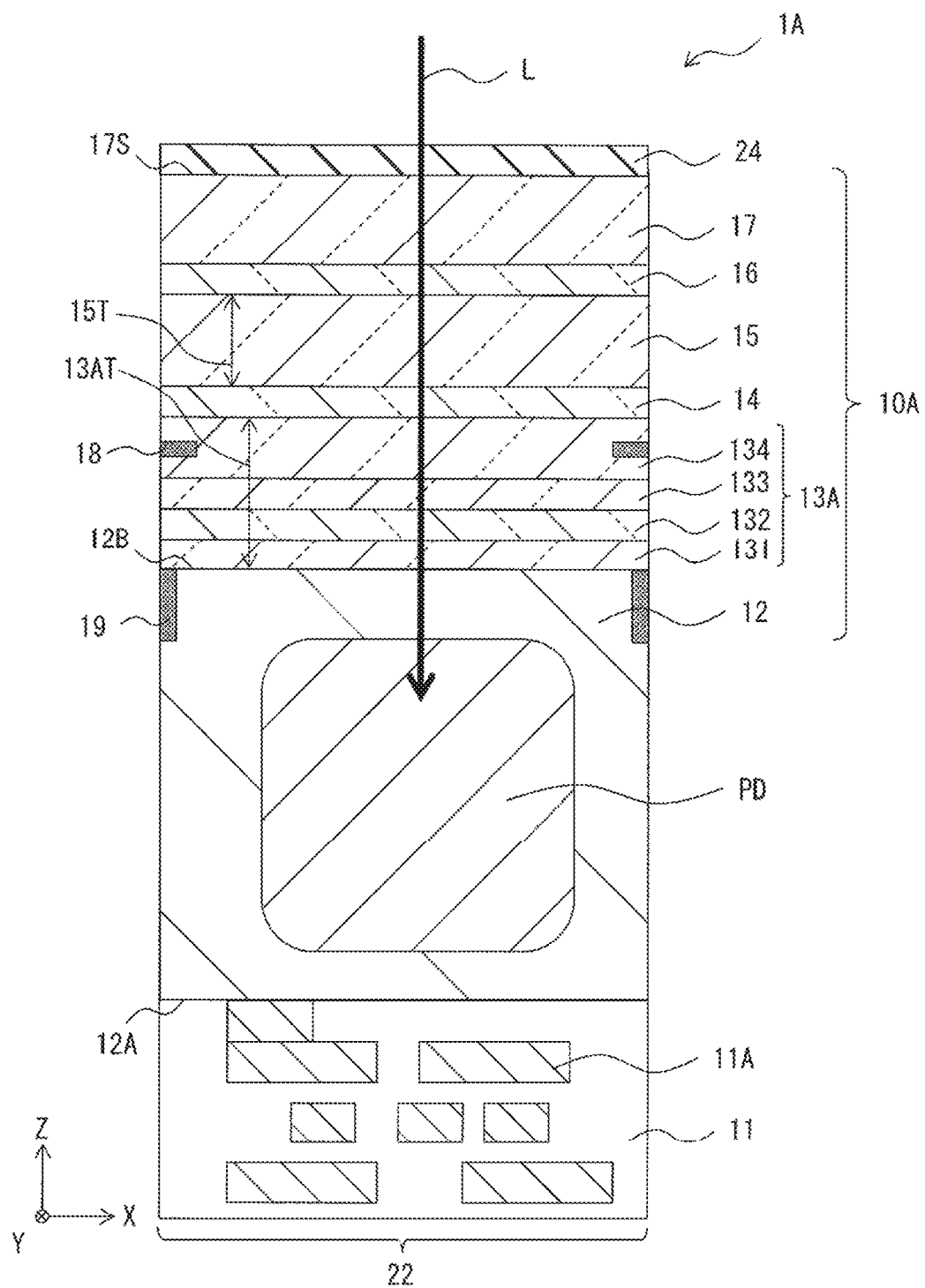
[FIG. 8]

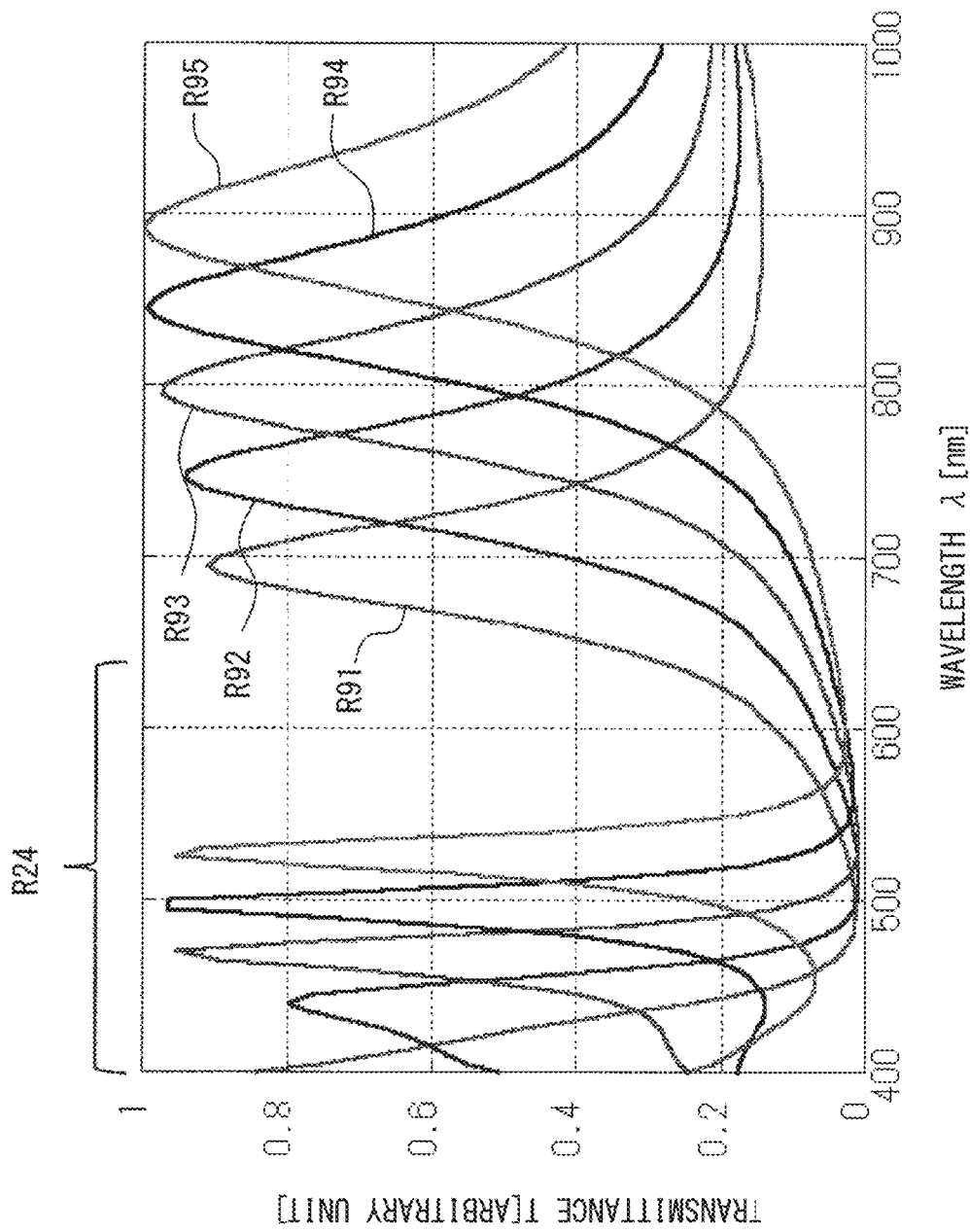
[FIG. 9]

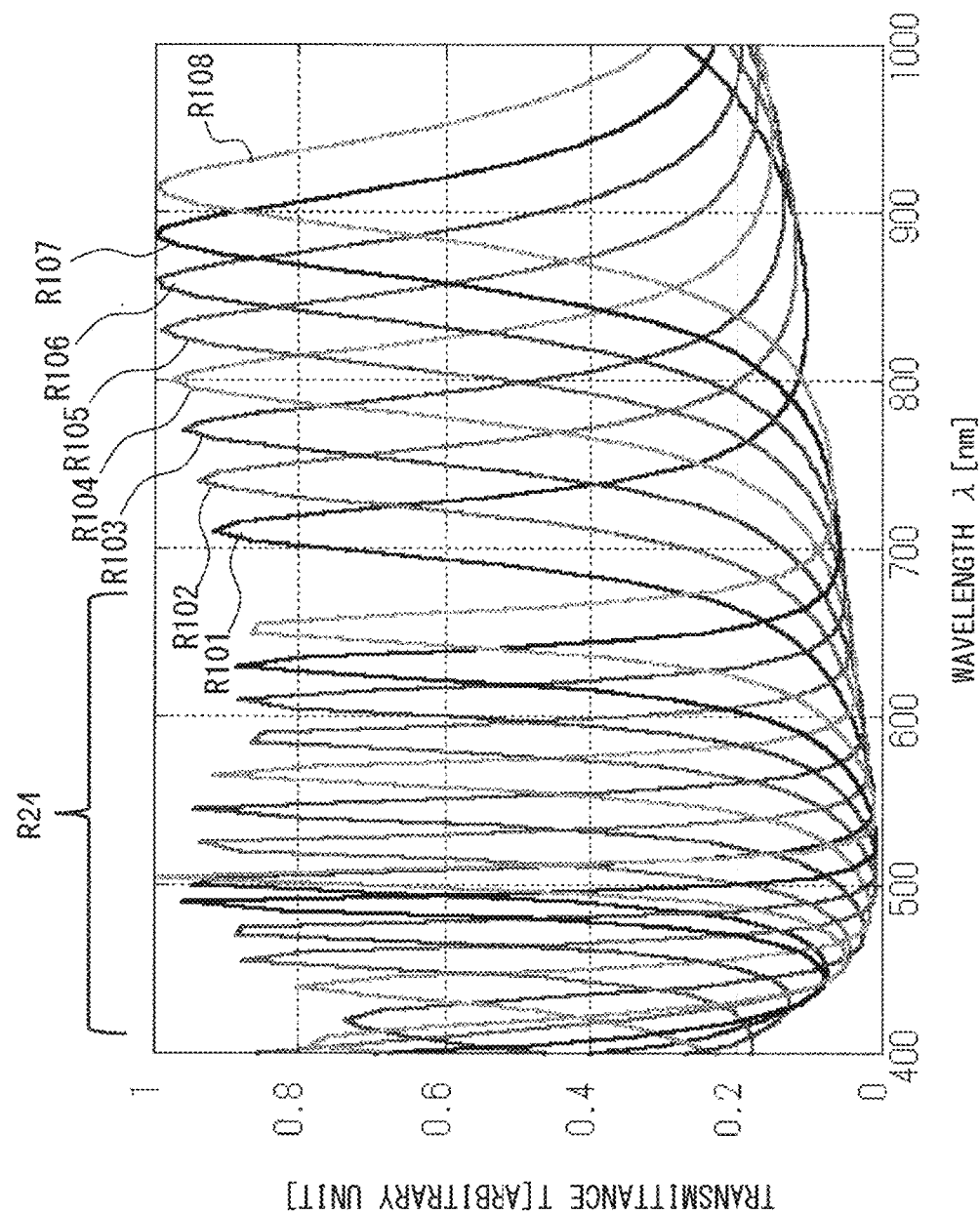
[FIG. 10]

[FIG. 11]
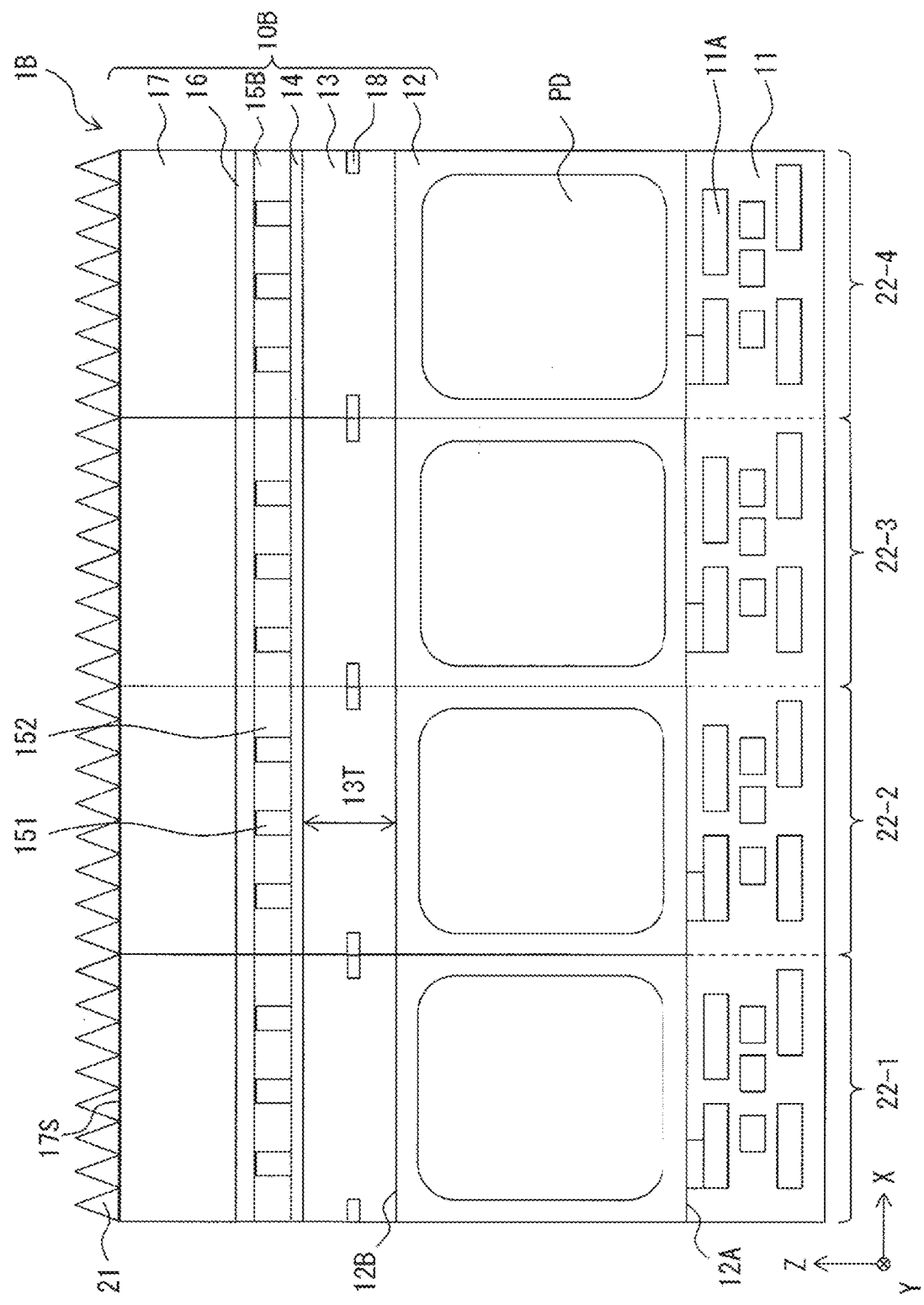

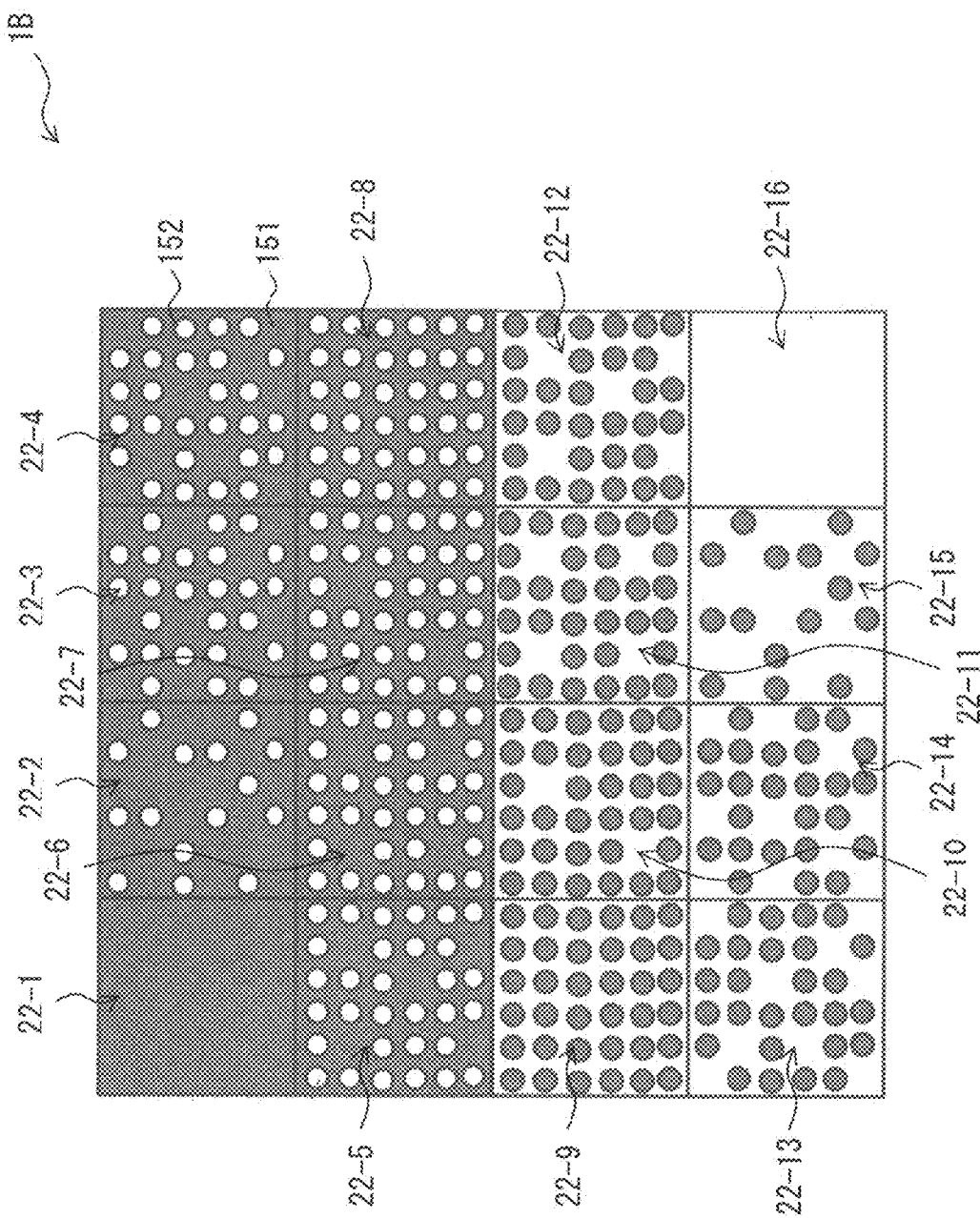
[FIG. 12]

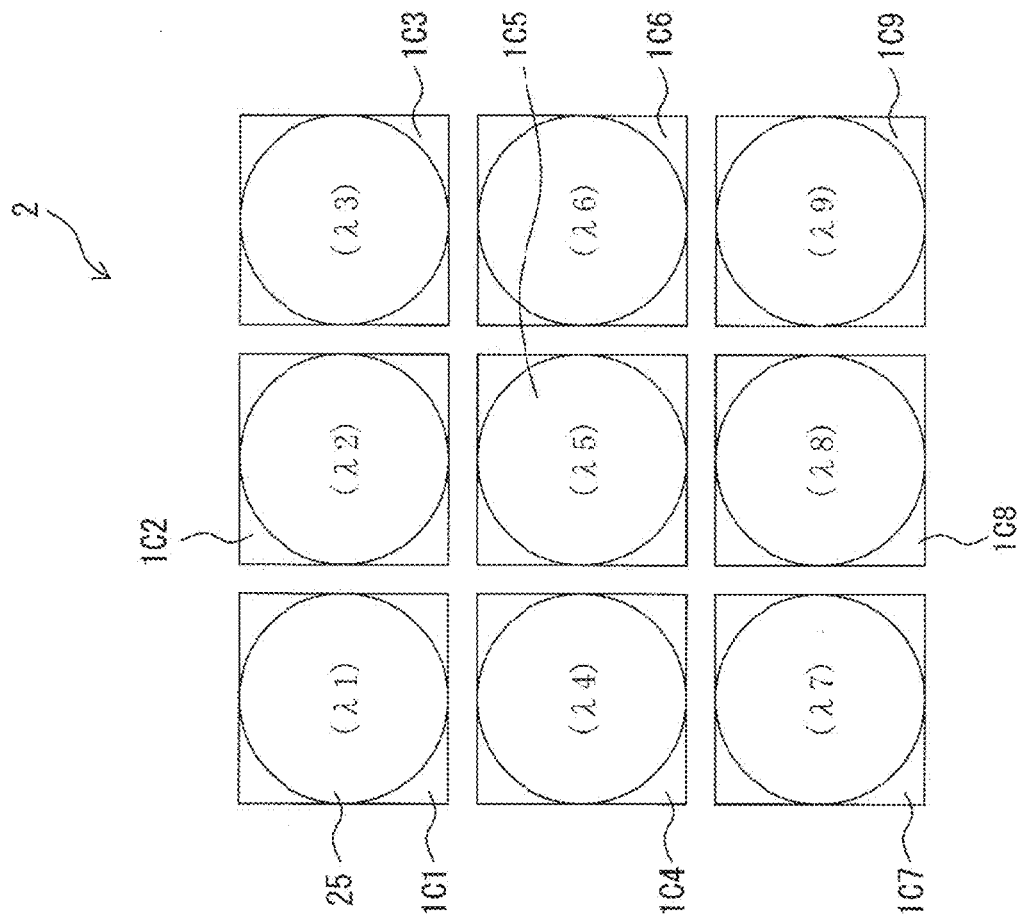
[FIG. 13]

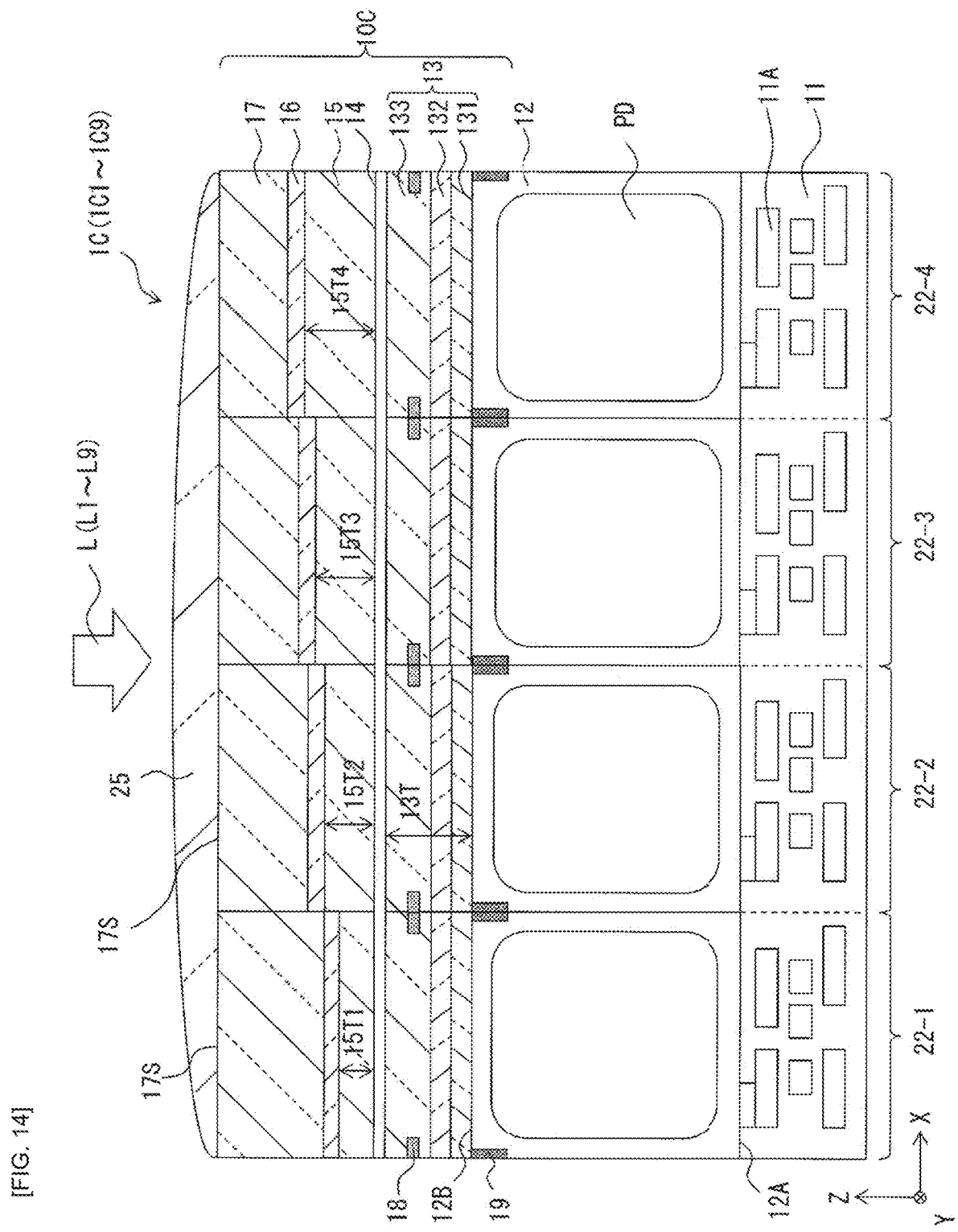

[FIG. 15]
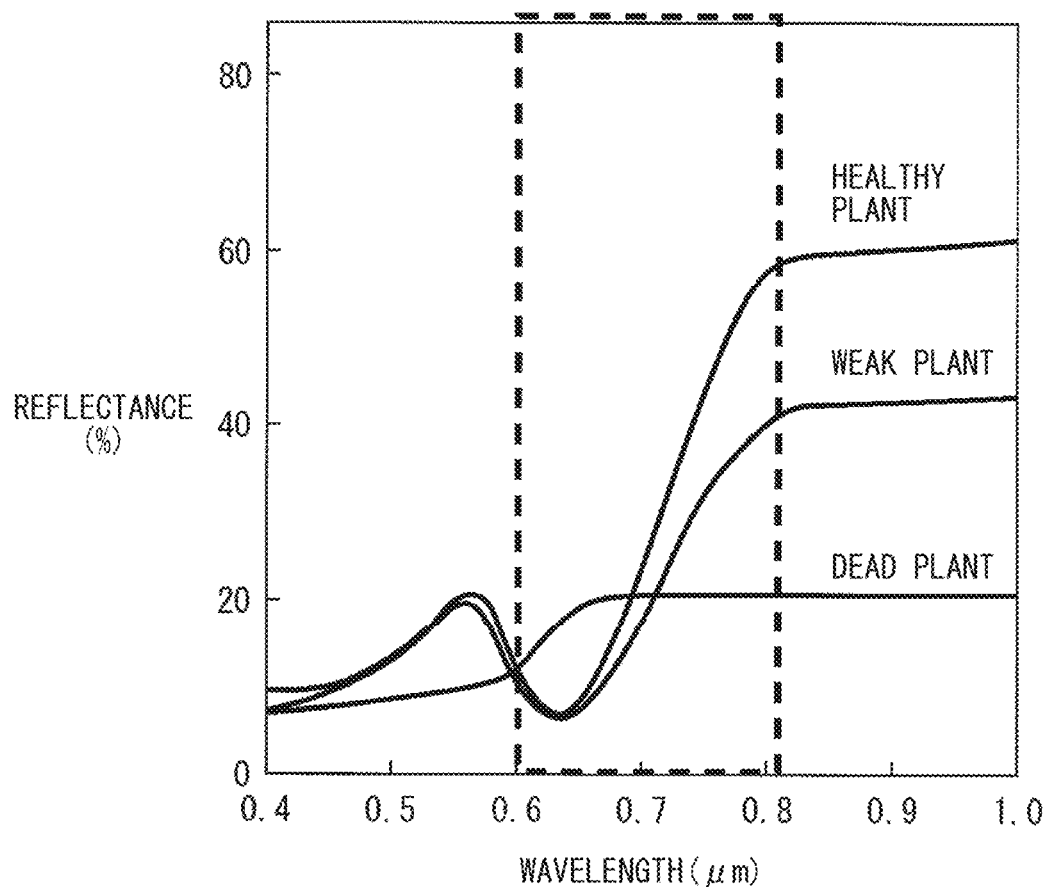
SPECTRAL CHARACTERISTICS DEPENDING VEGETATION STATE

[FIG. 16]
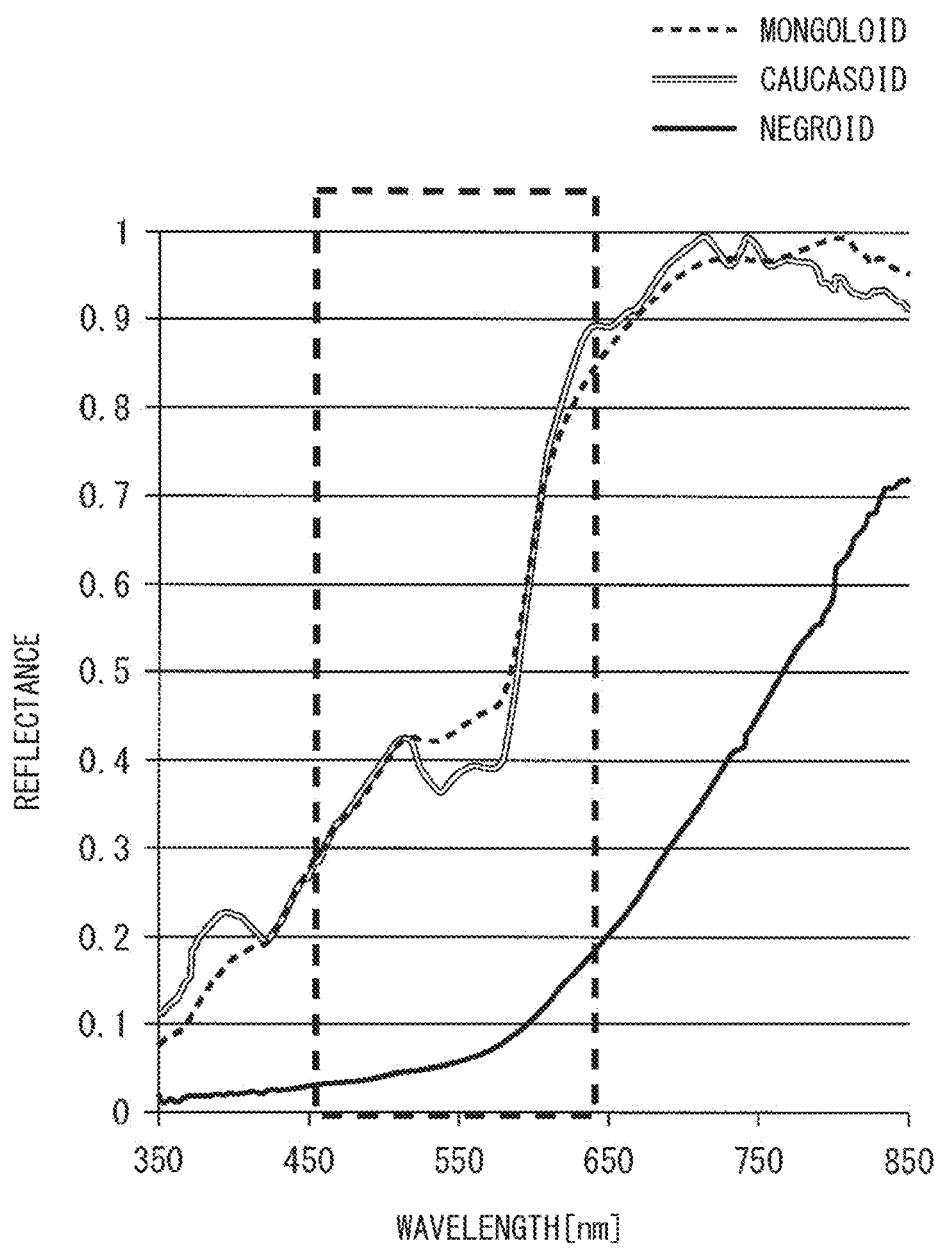
REFLECTANCE SPECTRUM OF HUMAN SKIN

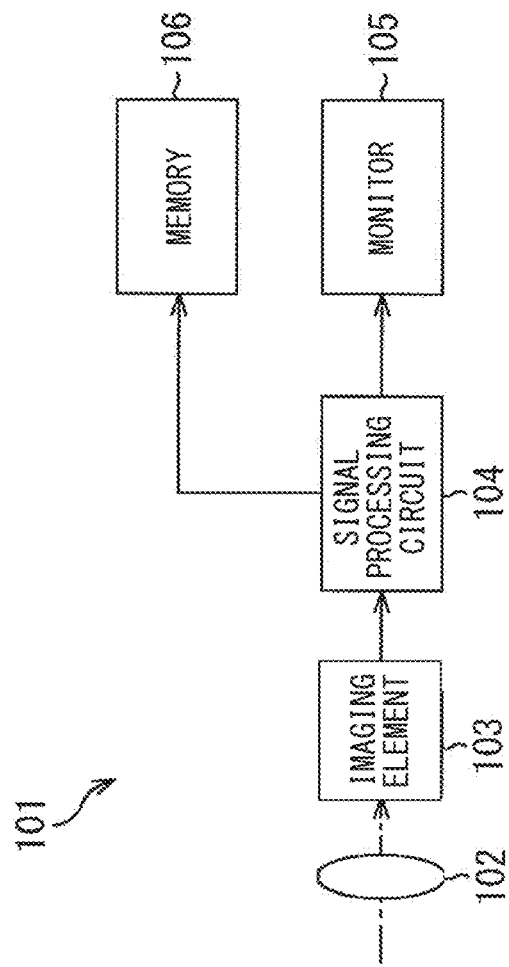
[FIG. 17]

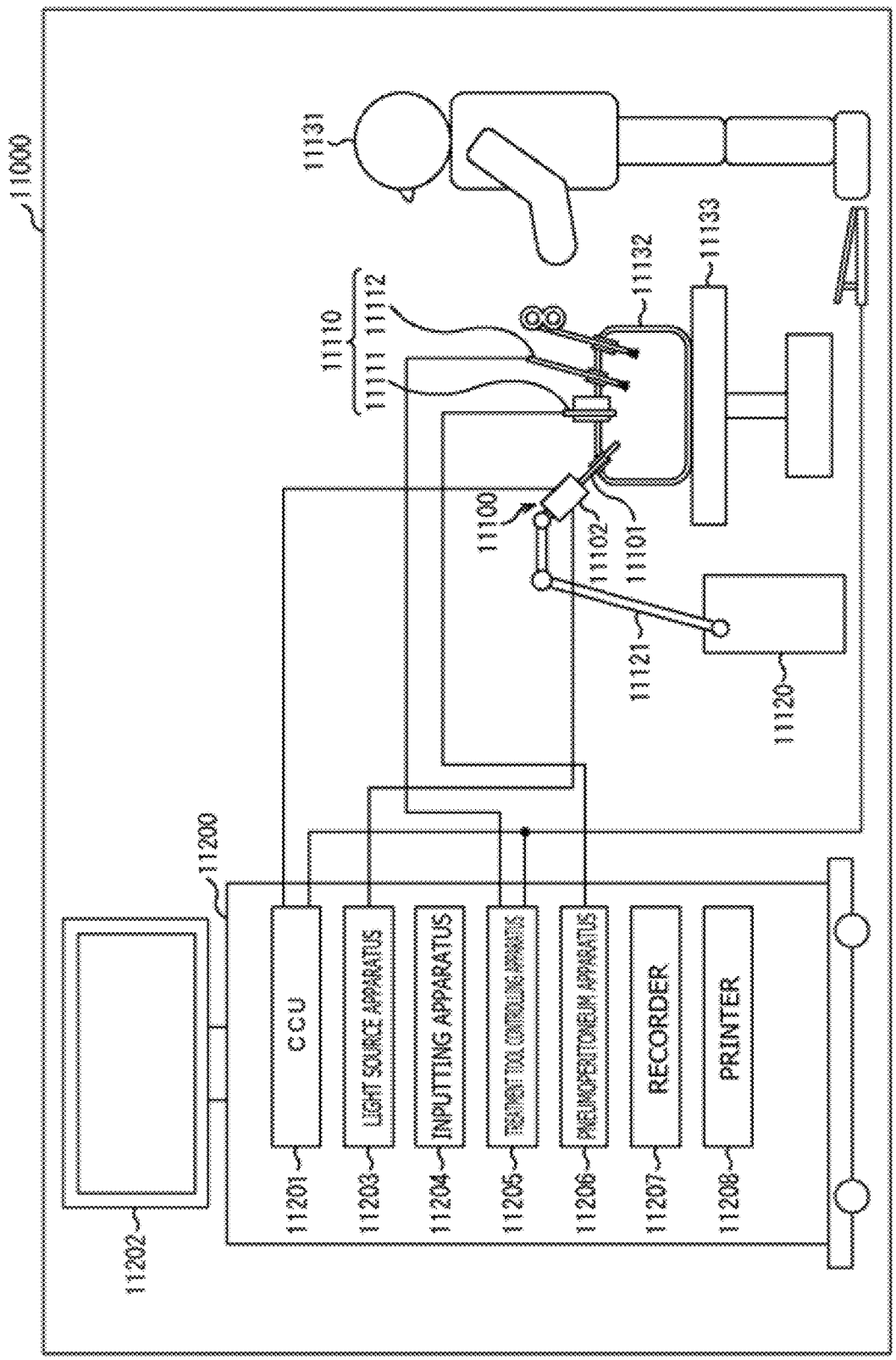
[FIG. 18]

[FIG. 19]
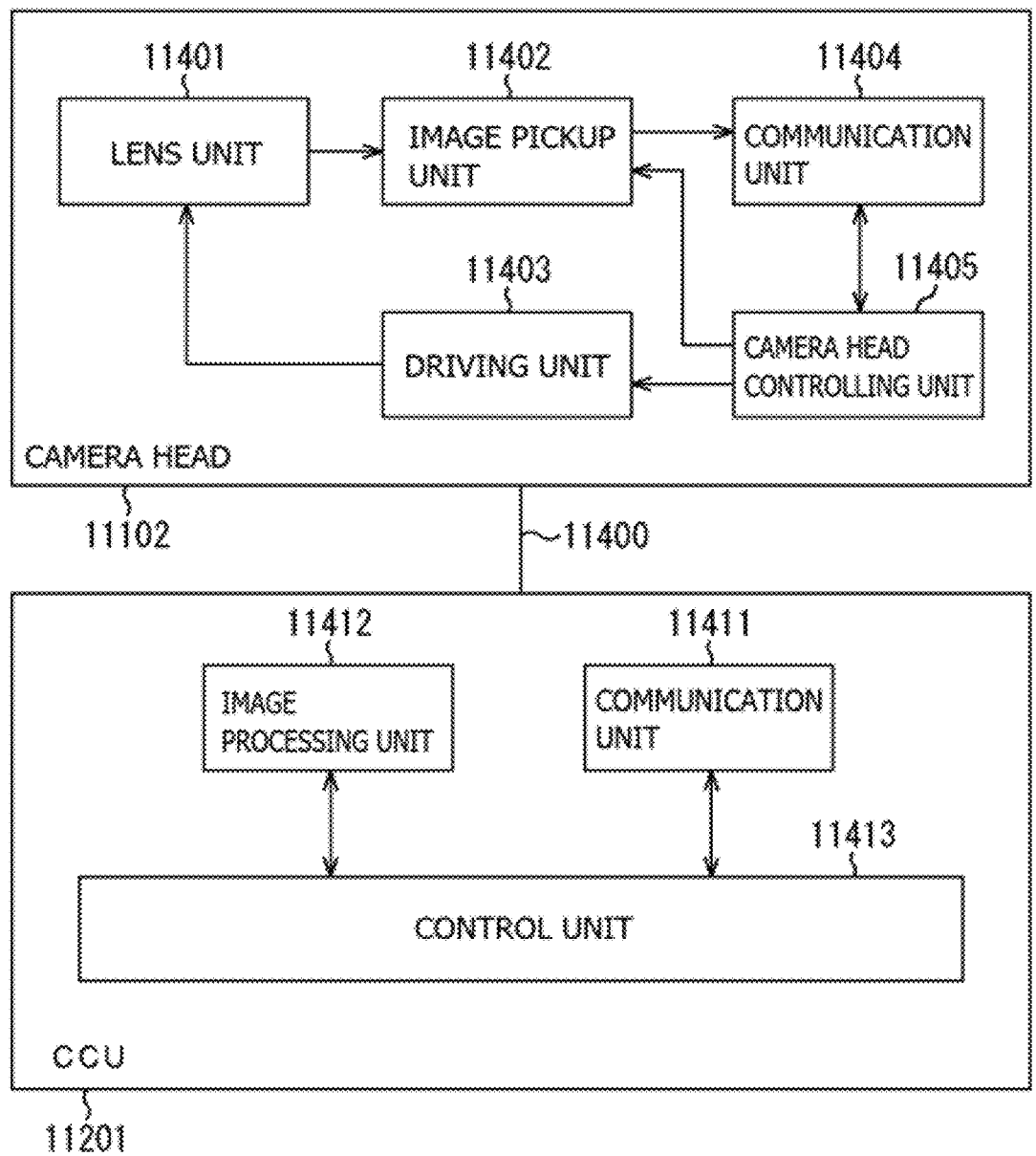

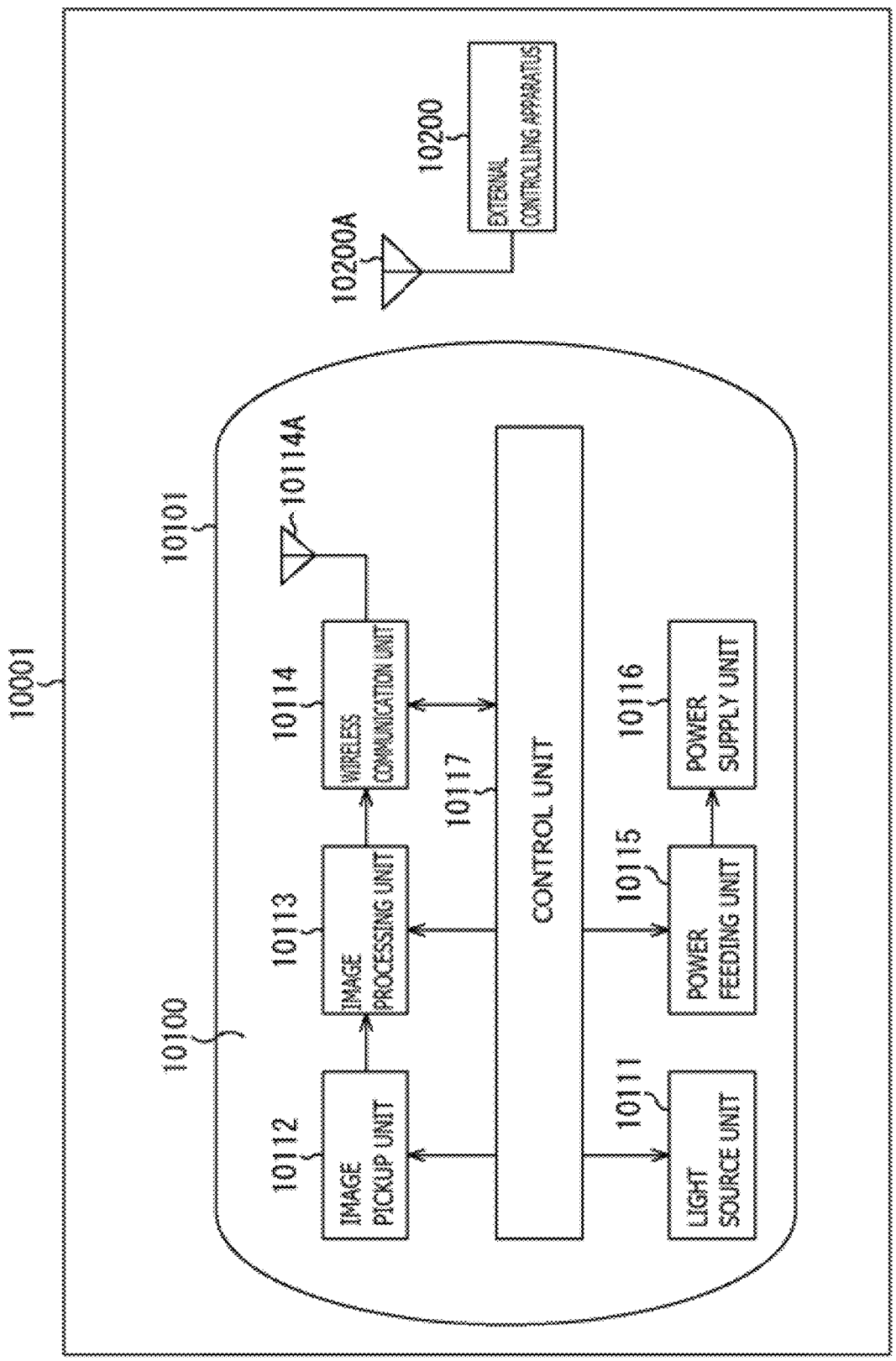
[FIG. 20]

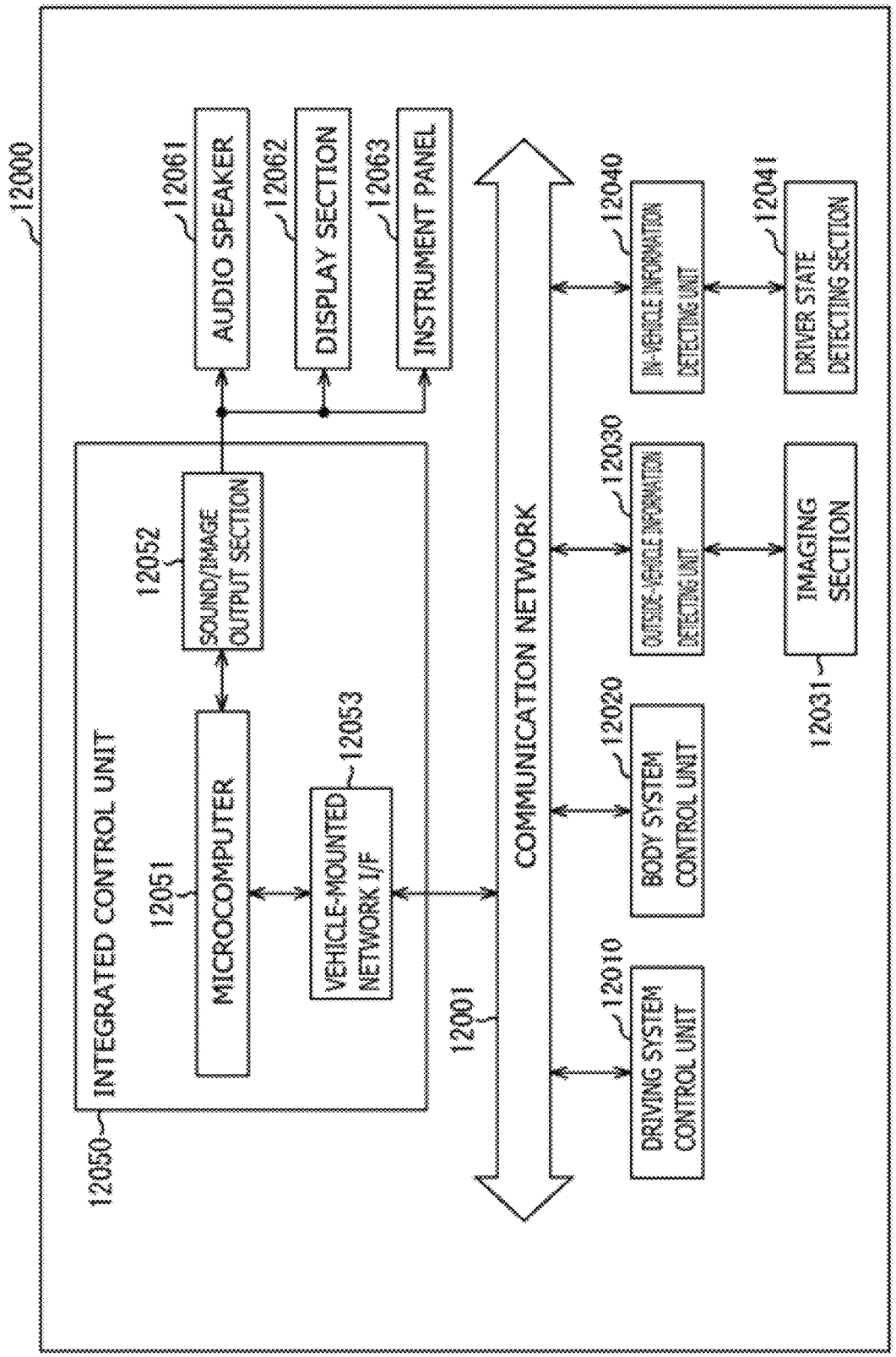
[FIG. 21]

[FIG. 22]
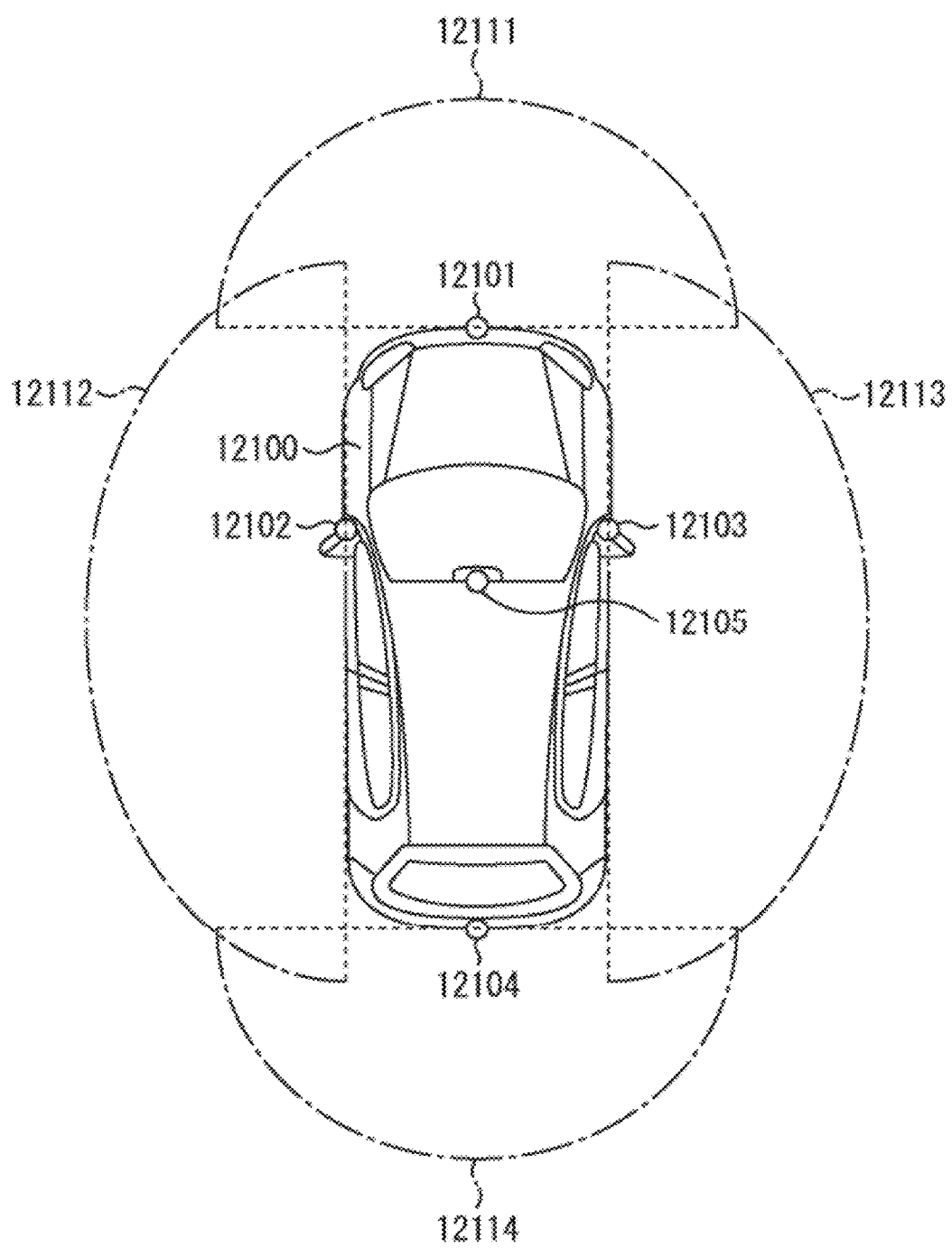

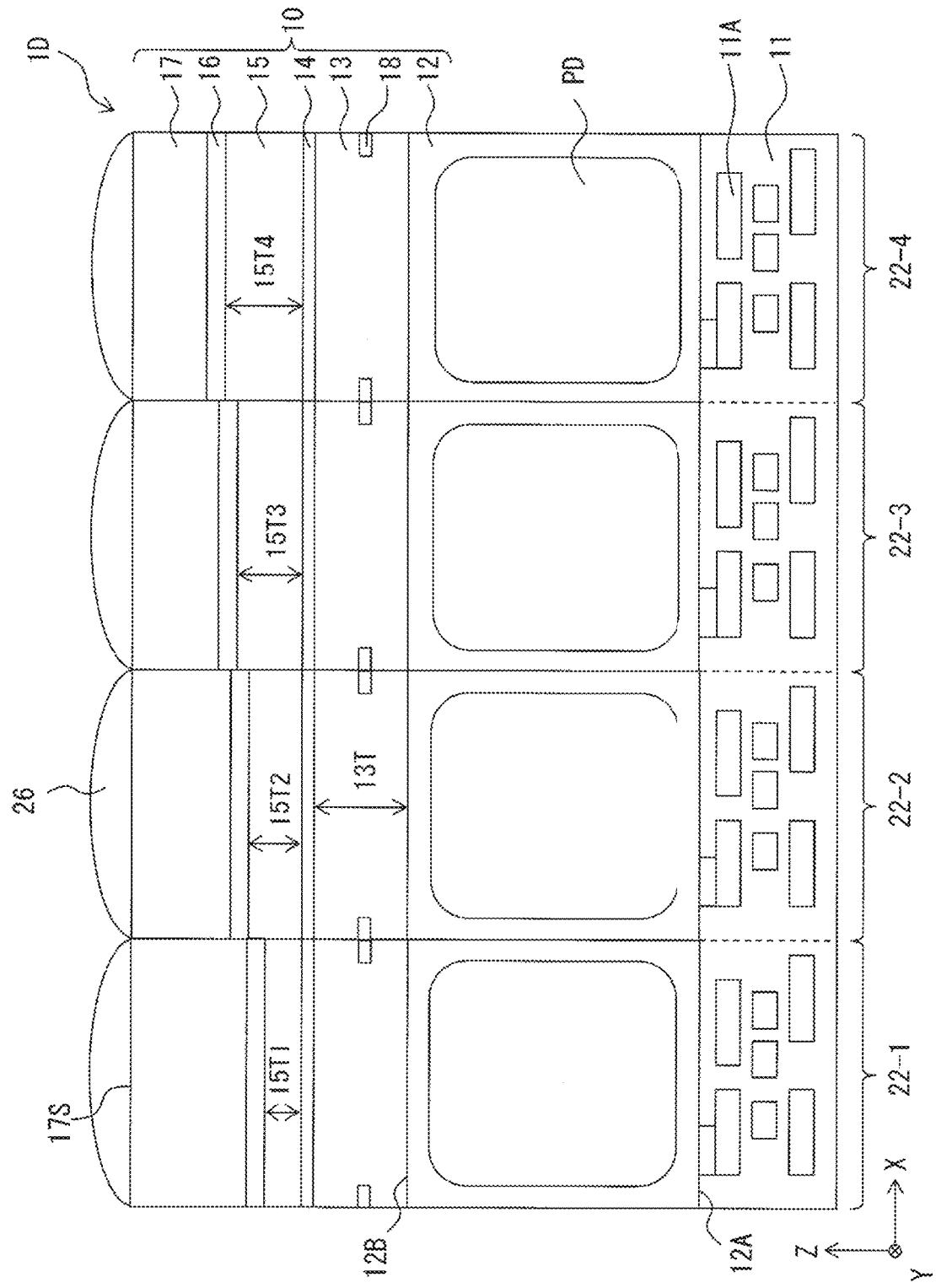

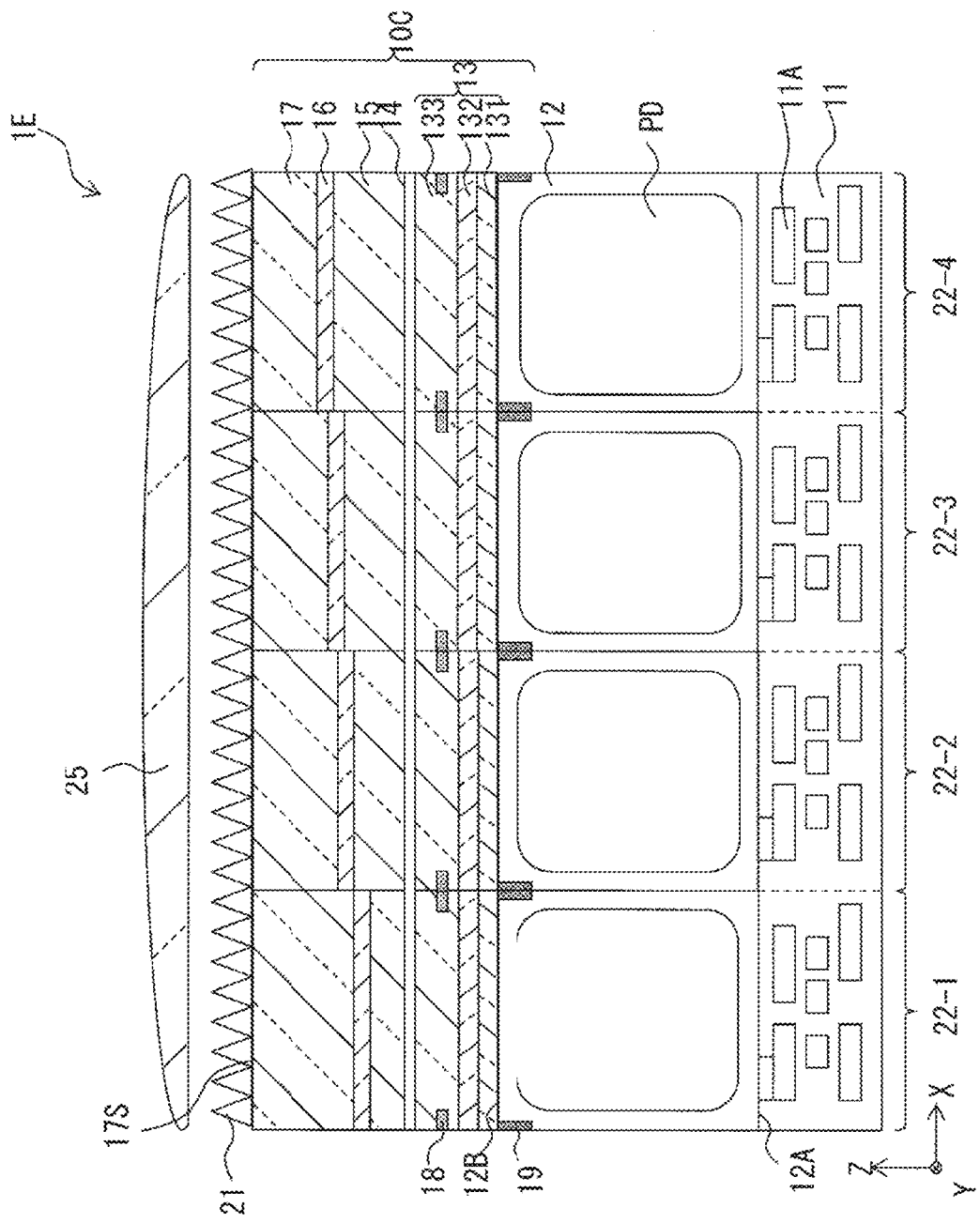
[FIG. 24]

RESONATOR STRUCTURE, IMAGING ELEMENT, AND ELECTRONIC APPARATUS

CROSS REFERENCE TO RELATED APPLICATIONS

This application is a U.S. National Phase of International Patent Application No. PCT/JP2019/019074 filed on May 14, 2019, which claims priority benefit of Japanese Patent Application No. JP 2018-096234 filed in the Japan Patent Office on May 18, 2018. Each of the above-referenced applications is hereby incorporated herein by reference in its entirety.

TECHNICAL FIELD

The present disclosure relates to a resonator structure including a resonator, and an imaging element and an electronic apparatus each including the resonator structure.

BACKGROUND ART

There have been proposed solid-state imaging devices each including a multilayer interference filter that includes a plurality of Fabry-Perot resonator structures having different thicknesses, thereby allowing light of a plurality of wavelength bands to be selectively transmitted therethrough (e.g., PTL 1).

CITATION LIST

Patent Literature

PTL 1: Japanese Unexamined Patent Application Publication No. 2006-351800

SUMMARY OF THE INVENTION

An imaging element able to perform such multispectral dispersion preferably has a structure having superior mass productivity while acquiring a highly accurate optical spectrum.

A resonator structure that obtains a highly accurate optical spectrum while having a simple structure, and an imaging element and an electronic apparatus each including the resonator structure are therefore desired.

A resonator structure as an embodiment of the present disclosure includes a stacked structure that includes a semiconductor layer, a first resonator, a first reflection layer, a second resonator, a second reflection layer stacked in this order, allows light of a specific wavelength band to be transmitted therethrough, the semiconductor layer having a first average refractive index, the first resonator having a second average refractive index lower than the first average refractive index, and the first reflection layer having a third average refractive index higher than the second average refractive index. In addition, an imaging element and an electronic apparatus as embodiments of the present disclosure each include the resonator structure described above.

According to the resonator structure, the imaging element, and the electronic apparatus as the embodiments of the present disclosure, it is possible to obtain a highly accurate optical spectrum while having a simple configuration.

It is to be noted that the effects of the present disclosure are not limited to the effects described above, and may be any effect described below.

BRIEF DESCRIPTION OF THE DRAWINGS

FIG. 1 is a schematic cross-sectional view of an entire configuration example of an imaging element according to a first embodiment of the present disclosure.

FIG. 2 is a schematic enlarged cross-sectional view of a main part of the imaging element illustrated in FIG. 1.

FIG. 3 illustrates an example of a periodic spectral arrangement by a resonator filter of the imaging element illustrated in FIG. 1.

FIG. 4A is a cross-sectional view of a process of a method of manufacturing the imaging element illustrated in FIG. 1.

FIG. 4B is a cross-sectional view of a process subsequent to FIG. 4A.

FIG. 5 is a characteristic diagram illustrating an example of thickness dependency of a first resonator in transmittance of light transmitted through a resonator structure illustrated in FIG. 1.

FIG. 6 is a characteristic diagram illustrating an example of spectral characteristics in the resonator structure illustrated in FIG. 1.

FIG. 7 is a schematic cross-sectional view of an entire configuration example of an imaging element according to a first modification example of the first embodiment of the present disclosure.

FIG. 8 is a schematic enlarged cross-sectional view of a main part of the imaging element illustrated in FIG. 7.

FIG. 9 is a characteristic diagram illustrating spectral characteristics in a resonator structure illustrated in FIG. 7.

FIG. 10 is another characteristic diagram illustrating spectral characteristics in the resonator structure illustrated in FIG. 7.

FIG. 11 is a schematic cross-sectional view of an entire configuration example of an imaging element according to a second modification example of the first embodiment of the present disclosure.

FIG. 12 is a schematic plan view of a main part of the imaging element illustrated in FIG. 11.

FIG. 13 is a schematic plan view of an entire configuration example of a camera module according to a second embodiment of the present disclosure.

FIG. 14 is a schematic enlarged cross-sectional view of a main part of an imaging element illustrated in FIG. 13.

FIG. 15 is a characteristic diagram illustrating spectral characteristics of reflectance depending on an growth state of plants and the like.

FIG. 16 illustrates optical spectrum characteristics of reflectance of human skin.

FIG. 17 is a block diagram illustrating a configuration example of an imaging device mounted on an electronic apparatus.

FIG. 18 is a view depicting an example of a schematic configuration of an endoscopic surgery system.

FIG. 19 is a block diagram depicting an example of a functional configuration of a camera head and a camera control unit (CCU).

FIG. 20 is a block diagram depicting an example of a schematic configuration of an in-vivo information acquisition system.

FIG. 21 is a block diagram depicting an example of schematic configuration of a vehicle control system.

FIG. 22 is a diagram of assistance in explaining an example of installation positions of an outside-vehicle information detecting section and an imaging section.

FIG. 23 is a schematic cross-sectional view of an entire configuration example of an imaging element according to a third modification example of the first embodiment of the present disclosure.

FIG. 24 is a schematic cross-sectional view of an entire configuration example of an imaging element according to a first modification example of the second embodiment of the present disclosure.

MODES FOR CARRYING OUT THE INVENTION

Embodiments of the present disclosure are described in detail below with reference to drawings. It is to be noted that description is given in the following order.
1. First Embodiment: Example of Imaging Element Including Resonator Structure
2. Modification Examples of First Embodiment: Modification Examples of Imaging Element Including Resonator Structure
3. Second Embodiment: Example of Camera Module Including a Plurality of Imaging Elements
4. Application Examples of Imaging Device
5. Example of Practical Application to Endoscopic Surgery System
6. Example of Practical Application to In-Vivo Information Acquisition System
7. Example of Practical Application to Mobile Body
8. Other Modification Examples 1. First Embodiment: Example of Imaging Element

[Configuration of Imaging Element 1]

FIG. 1 is a schematic cross-sectional view of an entire configuration example of an imaging element 1 as a first embodiment of the present disclosure. FIG. 2 is a schematic enlarged cross-sectional view of any one pixel 22 of a plurality of pixels 22 included in the imaging element 1. The imaging element 1 is, for example, a visible light spectral type CMOS (Complementary Metal-Oxide-Semiconductor) image sensor.

As illustrated in FIG. 1, the imaging element 1 includes a photodiode PD as a photoelectric converter, the plurality of pixels 22 (22-1 to 22-4) each including a resonator structure 10 that transmits light of a specific wavelength band toward a photodiode PD. FIG. 1 illustrates four pixels 22-1 to 22-4 as an example; however, the number of pixels 22 included in the imaging element 1 is not limited thereto.

The photodiode PD is embedded in a semiconductor substrate 12, for example. A wiring layer 11 is provided on a front surface 12A of the semiconductor substrate 12. The wiring layer 11 includes a wiring line 11A included in a drive circuit that includes an MOSFET (Metal-Oxide Semiconductor Field-Effect Transistor) or the like used for driving of each of the plurality of pixels 22. The semiconductor substrate 12 is one component included in the resonator structure 10, and has a first average refractive index N1. The semiconductor substrate 12 includes a semiconductor material such as Si (silicon), for example. The first average refractive index N1 is about 4, for example. In the present application, the "average refractive index" refers to a refractive index averaged by a volume ratio in a case where a target object, for example, the semiconductor substrate 12, includes two or more kinds of components each having a different refractive index. For example, in a case where the semiconductor substrate 12 includes a mixture including a first material having a first refractive index n1 and a second material having a second refractive index n2 at a volume ratio of V1:V2, the average refractive index N is a value determined by:

N=(V1*n1+V2*n2)/(V1+V2).

The same applies to a case where the target object includes three or more kinds of components each having a different refractive index. In addition, in a case where the target object includes only one type of component, the refractive index of the component is the average refractive index N.

(Resonator Structure 10)

The resonator structure 10 includes the semiconductor substrate 12 and a stacked structure provided on a back surface 12B of the semiconductor substrate 12. The stacked structure includes, in order from the back surface 12B of the semiconductor substrate 12, a first resonator 13, a first reflection layer 14, a second resonator 15, a second reflection layer 16, and a transparent layer 17 that are stacked in order. Here, the first resonator 13 has a second average refractive index N2 lower than the first average refractive index N1. In addition, the first reflection layer 14 has a third average refractive index N3 higher than the second average refractive index N2.

The first resonator 13 includes a multilayer film structure in which a plurality of films is stacked. The plurality of films includes a material containing at least one kind of silicon oxide, silicon nitride, tantalum oxide, or aluminum oxide. Specifically, the first resonator 13 includes, for example, a first film 131 including silicon dioxide ($SiO_2$), a second film 132 including silicon nitride (SiN), and a third film 133 including silicon dioxide ($SiO_2$) that are stacked in this order from the back surface 12B side. A thickness 13T of the first resonator 13 is desirably, for example, 400 nm or less.

The first reflection layer 14, the second resonator 15, and the second reflection layer 16 form a so-called Fabry-Perot resonator structure. Accordingly, wavelength selectivity appears in transmittance of light L transmitted through the first reflection layer 14, the second resonator 15, and the second reflection layer 16. The first reflection layer 14 and the second reflection layer 16 each include, for example, polycrystal silicon (Si), and function as a reflection film. Each of the thickness of the first reflection layer 14 and the thickness of the second reflection layer 16 may be 50 nm or less. Polycrystal silicon (Si) has a large light absorption coefficient in a short wavelength band, which causes reduction in transmittance of transmitted light. For this reason, reducing both the thickness of the first reflection layer 14 and the thickness of the second reflection layer 16 to 50 nm or less, for example, to about 30 nm, makes it possible to minimize light absorption in the first reflection layer 14 and the second reflection layer 16. The second resonator 15 includes, for example, silicon dioxide ($SiO_2$). In the imaging element 1, others, except for the first reflection layer 14, the second reflection layer 16, and the semiconductor substrate 12, may include a material other than elemental silicon. In the imaging element 1, for example, as in a schematic view of a pixel arrangement illustrated in FIG. 3, the plurality of pixels 22 including the second resonators 15 having thicknesses different from each other are periodically arranged in a stacked plane (in an XY plane orthogonal to a Z-axis direction that is a stacking direction). It is to be noted that FIG. 3 illustrates an example in which pixels 22-1 to 22-16 each including the second resonator 15 having a different thickness 15T are periodically arranged. FIG. 1 illustrates the pixels 22-1 to 22-4 of the pixels 22-1 to 22-16 as an example. The pixels 22-1 to 22-4 respectively include the second resonators 15 having thicknesses 15T1 to 15T4. That is, the pixels 22-1 to 22-16 are regarded as a pixel group 22G for one cycle, and a plurality of pixel groups 22G is repeatedly arranged in the stacked plane. Here, wavelength selectivity for the light L in the Fabry-Perot resonator structure including the first reflection layer 14, the second resonator 15, and the second reflection layer 16 is dependent on the thickness 15T of the second resonator 15. Accordingly, the plurality of pixels 22 including the second resonators 15 having different thicknesses is periodically arranged as in FIG. 3, which allows for multispectral dispersion in the imaging element 1.

The transparent layer 17 includes a transparent body including, for example, silicon dioxide ($SiO_2$) as a main constituent material. Front surfaces 17S of the transparent layers 17 in the plurality of pixels 22 are located at height positions substantially equal to each other.

Each of light shielding layers 18 and 19 may be provided in proximity to a boundary between adjacent pixels 22. The light shielding layer 18 is embedded in the third film 133 of the first resonator 13, for example. In addition, the light shielding layer 18 is provided in proximity to the back surface 12B of the semiconductor substrate 12, for example. This is to prevent light leakage between adjacent pixels 22 and avoid color mixture.

For example, a moth eye (Moth Eye) structure 21 is provided on a front surface 17S of the transparent layer 17. This is to suppress front surface reflection in the front surface 17S of the transparent layer 17 and reduce spectrum vibration. The moth eye structure 21 is a structure having a plurality of pointed projections arranged on the front surface 17S at a pitch of a wavelength λ or less, in particular at a pitch of 1/3×λ or less. It is possible to form the moth eye structure 21 as follows. First, for example, as illustrated in FIG. 4A, a transparent ultraviolet curable resin layer 21Z having a uniform thickness is applied by, for example, a spin coating method to cover the front surface 17S of the transparent layer 17. Meanwhile, a mold 23 in which a predetermined recessed and projected pattern 23P is formed is prepared. The mold 23 has the fine recessed and projected pattern 23 formed by dry etching a substrate such as a Si substrate, which allows ultraviolet rays to be transmitted therethrough, with use of a resist pattern formed by electron beam lithography, for example. Next, as illustrated in FIG. 4B, the recessed and projected pattern 23P is pressed against the ultraviolet curable resin layer 21Z. Further, while maintaining that state, that is, a state in which the recessed and projected pattern 23P is pressed against the ultraviolet curable resin layer 21Z, the ultraviolet curable resin layer 21Z is irradiated with ultraviolet rays UV having a predetermined intensity for a predetermined period of time to cure the ultraviolet curable resin layer 21Z. After the ultraviolet curable resin layer 21Z is cured, the mold 23 is removed, thereby obtaining the moth eye structure 21.

[Workings of Imaging Element 1]

In the imaging element 1, for example, a resonator length in the first resonator 13, that is, the thickness 13T (see FIG. 2) as a dimension in the Z-axis direction of the first resonator 13 is changed, which makes it possible to change a shape of a peak wavelength of transmitted light transmitted through the resonator structure 10. As previously described, the first resonator 13 is provided between the semiconductor substrate 12 in which the photodiode PD is embedded and the first reflection layer 14 that forms the Fabry-Perot resonator structure. The second average refractive index N2 of the first resonator 13 is lower than the first average refractive index N1 in the semiconductor substrate 12 and lower than the third average refractive index N3 in the first reflection layer 14. Accordingly, the first resonator 13 exhibits coherence, and wavelength selectivity for transmitted light in the resonator structure 10 is improved. Si (silicon) is suitable as constituent materials of the semiconductor substrate 12 and the first reflection layer 14. An average refractive index of silicon is about 4. For this reason, the second average refractive index N2 of the first resonator 13 is desirably 1 or more and 4 or less. This is because a sufficient interference effect in the first resonator 13 is obtained. The second average refractive index N2 of the first resonator 13 may be specifically 1 or more and 2 or less. This is because the interference effect in the first resonator 13 is further improved.

FIG. 5 illustrates an example of dependency of the first resonator 13 on the thickness 13T at transmittance T of the light transmitted through the resonator structure 10. In FIG. 5, an upper left graph represents a case of the thickness 13T=1100 nm, an upper right graph represents a case of the thickness 13T=600 nm, a lower left graph represents a case of the thickness 13T=400 nm, and a lower right graph represents a case of the thickness 13T=200 nm. It is to be noted that FIG. 5 illustrates results of simulating an optical spectrum by the effective Fresnel coefficient method in a case where the light L having entered the resonator structure 10 from the front surface 17S is transmitted through the resonator structure 10. In addition, in each of the cases, FIG. 5 corresponds to a case where the semiconductor substrate 12 includes Si (silicon), the first film 131 includes SiO2, the second film 132 includes SiO2, the third film 133 includes SiO2, the first reflection layer 14 includes polycrystal silicon (Si) having a thickness of 31 nm, the second resonator 15 includes SiO2 having a thickness of 147 nm, the second reflection layer 16 includes polycrystal silicon (Si) having a thickness of 31 nm, and the transparent layer 17 includes SiO2 having a thickness of 100 nm. As illustrated in FIG. 5, it can be seen that in a case where the thickness 13T of the first resonator 13 is 400 nm or less, an unimodal peak appearing in a wavelength band of 400 nm to 500 nm is obtained in a transmittance distribution of the light L transmitted, and wavelength selectivity suitable in performing multispectral dispersion is obtained.

In the imaging element 1, for example, changing a resonator length in the second resonator 15, that is, the thickness 15T (see FIG. 2) as the dimension in the Z-axis direction of the second resonator 15 makes it possible to change the position of a peak wavelength of visible light transmitted through the resonator structure 10. Specifically, in the imaging element 1, for example, changing the thickness 15T in a range from 147 nm to 215 nm allows for dispersion into blue light, green light, and red light.

FIG. 6 illustrates an example of dependency of the second resonator 15 on the thickness 15T at the transmittance T of the light L transmitted through the resonator structure 10. In FIG. 6, a curve R61 represents a case of the thickness 15T=147 nm, a curve R62 represents a case of the thickness 15T=180 nm, and a curve R63 represents a case of the thickness 15T=215 nm. It is to be noted that FIG. 6 corresponds to a case where the semiconductor substrate 12 includes Si (silicon), the first film 131 includes $SiO_2$ having a thickness of 10 nm, the second film 132 includes $SiO_2$ having a thickness of 56 nm, the third film 133 includes $SiO_2$ having a thickness of 20 nm, the first reflection layer 14 includes polycrystal silicon (Si) having a thickness of 31 nm, the second resonator 15 includes $SiO_2$, the second reflection layer 16 includes polycrystal silicon (Si) having a thickness of 31 nm, and the transparent layer 17 includes $SiO_2$ having a thickness of 100 nm. As illustrated in FIG. 6, changing the thickness 15T of the second resonator 15 allows for dispersion into three colors of blue, green, and red, for example. In addition, it is also possible to reduce the half width of each peak to a narrow width of 50 nm or less. Accordingly, in the imaging element 1, the pixels 22-1 to 22-15 including the second resonators 15 having different thicknesses 15T are periodically arranged as illustrated in FIG. 3, which allows for multispectral dispersion.

[Effects of Imaging Element 1]

As described above, the resonator structure 10 of the imaging element 1 includes the semiconductor substrate 12, the first resonator 13, the first reflection layer 14, the second resonator 15, and the second reflection layer 16 that are stacked in this order, and allows the light L of a specific wavelength band to be transmitted therethrough. The first resonator 13 has the second average refractive index N2 lower than both the first average refractive index N1 in the semiconductor substrate 12 and the third average refractive index N3 in the first reflection layer 14. Accordingly, the resonator structure 10 and the imaging element 1 obtain a highly accurate optical spectrum while having a simple structure including a relatively small number of layers.

In the imaging element 1, the peak wavelength of the intensity of the light L transmitted is changed, for example, depending on the thickness 15T of the second resonator 15 provided on a side opposite to the semiconductor substrate 12 as viewed from the first resonator 13 in the resonator structure 10. In the imaging element 1, the pixels 22 including a plurality of resonator structures 10 having different thicknesses 15T are periodically arranged with use of this property, which allows for multispectral dispersion.

In particular, in the resonator structure 10, the thickness 13T of the first resonator 13 is 400 nm or less, thereby obtaining a unimodal peak appearing in a wavelength band of 400 nm to 500 nm in the transmittance distribution of the light L transmitted, and obtaining wavelength selectivity suitable in performing multispectral dispersion.

In addition, in the resonator structure 10, setting each of the thickness of the first reflection layer 14 and the thickness of the second reflection layer 16 to 50 nm or less makes it possible to minimize light absorption in the first reflection layer 14 and the second reflection layer 16.

2. Modification Examples of First Embodiment: Modification Examples of Imaging Element 2.1 First Modification Example

[Configuration of Imaging Element 1A]

FIG. 7 is a schematic cross-sectional view of an entire configuration example of an imaging element 1A as a first modification example of the first embodiment of the present disclosure. FIG. 8 is a schematic enlarged cross-sectional view of an enlarged view of any one pixel 22 of the plurality of pixels 22 included in the imaging element 1A. The imaging element 1A is, for example, an infrared spectral type CMOS image sensor.

In the imaging element 1 according to the first embodiment described above, the first resonator 13 having a three-layer structure has been described as an example. In contrast, the imaging element 1A as the present modification example includes a resonator structure 10A that includes a first resonator 13A having a four-layer structure. Specifically, the first resonator 13A in the resonator structure 10A includes the first film 131, the second film 132, the third film 133, and a fourth film 134 that are stacked in this order from the back surface 12B side. Each of the first film 131 and the fourth film 134 includes, for example, silicon dioxide ($SiO_2$). The second film 132 includes, for example, aluminum oxide (AlO). The third film 133 includes, for example, tantalum oxide (TaO). A thickness 13AT of the first resonator 13A is desirably 400 nm or less, for example. The first resonator 13A has the second average refractive index N2 lower than both the first average refractive index N1 in the semiconductor substrate 12 and the third average refractive index N3 in the first reflection layer 14.

In addition, the imaging element 1A includes a visible light cut filter 24 instead of the moth eye structure 21 on the front surface 17S of the transparent layer 17.

Except for these points, the imaging element 1A as a modification example 1 has substantially the same configuration as the imaging element 1.

[Workings of Imaging Element 1A]

The resonator structure 10A in the imaging element 1A has, for example, an overall thickness of 1 μm or less, and sufficiently suppresses color mixture. Furthermore, changing the thickness 15T of the second resonator 15, for example, in a range from 250 nm to 350 nm makes it possible to spectrally disperse infrared light.

FIG. 9 is a characteristic diagram illustrating an example of dependency of the second resonator 15 on the thickness 15T at the transmittance T of the light L transmitted through the resonator structure 10A. In FIG. 9, a curve R91 represents a case of the thickness 15T=250 nm, a curve R92 represents a case of the thickness 15T=275 nm, a curve R93 represents a case of the thickness 15T=300 nm, a curve R94 represents a case of the thickness 15T=325 nm, and a curve R95 represents a case of the thickness 15T=350 nm. It is to be noted that FIG. 9 corresponds to a case where the semiconductor substrate 12 includes Si (silicon), the first film 131 includes $SiO_2$ having a thickness of 1 nm, the second film 132 includes AlO having a thickness of 7 nm, the third film 133 includes TaO having a thickness of 54 nm, the fourth film 134 includes $SiO_2$ having a thickness of 20 nm, the first reflection layer 14 includes polycrystal silicon (Si) having a thickness of 31 nm, the second resonator 15 includes $SiO_2$, the second reflection layer 16 includes polycrystal silicon (Si) having a thickness of 31 nm, and the transparent layer 17 includes $SiO_2$ having a thickness of 110 nm.

In addition, in the resonator structure 10A in the imaging element 1A, changing the thickness 15T of the second resonator 15 as a higher-order mode Fabry-Perot structure, for example, in a range from 500 nm to 625 nm makes it possible to obtain an optical spectrum having peaks, each with a narrow half-width.

FIG. 10 is another characteristic diagram illustrating an example of dependency of the second resonator 15 on the thickness 15T at the transmittance T of the light L transmitted through the resonator structure 10A. In FIG. 10, a curve R101 represents a case of the thickness 15T=500 nm, a curve R102 represents a case of the thickness 15T=525 nm, a curve R103 represents a case of the thickness 15T=550 nm, a curve R104 represents a case of the thickness 15T=575 nm, a curve R105 represents a case of the thickness 15T=600 nm, a curve R106 represents a case of the thickness 15T=625 nm, a curve R107 represents a case of the thickness 15T=650 nm, and a curve R108 represents a case of the thickness 15T=675 nm. It is to be noted that FIG. 10 corresponds to a case where the semiconductor substrate 12 includes Si (silicon), the first film 131 includes $SiO_2$ having a thickness of 1 nm, the second film 132 includes AlO having a thickness of 7 nm, the third film 133 includes TaO having a thickness of 54 nm, the fourth film 134 includes SiO₂ having a thickness of 20 nm, the first reflection layer 14 includes polycrystal silicon (Si) having a thickness of 31 nm, the second resonator 15 includes SiO₂, the second reflection layer 16 includes polycrystal silicon (Si) having a thickness of 31 nm, and the transparent layer 17 includes SiO₂ having a thickness of 110 nm.

[Effects of Imaging Element 1A]

As illustrated in FIGS. 9 and 10, changing the thickness 15T of the second resonator 15 allows for spectral dispersion into, for example, light having five different peak wavelengths in an infrared region. It is to be noted that an optical spectrum in the resonator structure 10A also includes a peak of visible light. Accordingly, a component in a visible light region R24 of the light L entering the resonator structure 10A is removed by the visible light cut filter 24, which makes it possible to obtain an optical spectrum only in the infrared region in the imaging element 1A.

In addition, the first resonator 13A has the second average refractive index N2 lower than both the first average refractive index N1 in the semiconductor substrate 12 and the third average refractive index N3 in the first reflection layer 14. Accordingly, the resonator structure 10 and the imaging element 1A obtain a highly accurate optical spectrum while having a simple structure.

2.2 Second Modification Example

[Configuration of Imaging Element 1B]

FIG. 11 is a schematic cross-sectional view of an entire configuration example of an imaging element 1B as a second modification example of the first embodiment of the present disclosure. FIG. 12 is a schematic plan view of a configuration example of the second resonator 15 of a resonator structure 10B included in the imaging element 1B.

In the imaging element 1 according to the first embodiment described above, a plurality of pixels each including the second resonator 15 having a different thickness 15T are arranged, thereby changing the peak wavelength of the intensity of the light L transmitted through the respective pixels 22 to perform multispectral dispersion. In contrast, in the imaging element 1B as the present modification example, while resonator lengths in the plurality of pixels 22, i.e., the thicknesses 15T of the second resonators 15 are uniform, microstructures different for each of the pixels 22 are formed in the second resonators 15 of the respective pixels 22. Specifically, the second resonator 15 includes a first portion 151 having a first refractive index, and a second portion 152 as a microstructure that is dispersedly located in the first portion 151 in the stacked plane (in the XY plane) and has a second refractive index. Thus, the second resonator 15 has a refractive index distribution in the stacked plane. It is to be noted that "having a refractive index distribution" here means that the second resonator 15 has a different effective refractive index for each of the pixels 22. Here, the first portion 151 includes, for example, Si₃N₄, and the second portion 152 includes, for example, SiO₂. FIG. 12 illustrates, as an example, a state in which 16 types of pixels 22-1 to 22-16 each having a different existence ratio of the first portion 151 and the second portion 152 in the second resonator 15 are periodically arranged in a matrix.

[Workings and Effects of Imaging Element 1B]

Even in the imaging element 1B as the second modification example of the first embodiment, it is possible to obtain an optical spectrum having 16 kinds of different peak wavelengths.

3. Second Embodiment: Example of Camera Module

[Configuration of Camera Module 2]

FIG. 13 is a schematic plan view of an entire configuration example of a camera module 2 as a second embodiment of the present disclosure. FIG. 14 is a schematic enlarged cross-sectional view of any one of a plurality of imaging elements 1C (1C1 to 1C9) included in the camera module 2. The imaging element 1C is, for example, a visible light spectral type CMOS image sensor.

The camera module 2 includes nine imaging elements 1C1 to 1C9 arranged in, for example, three rows and three columns in the XY plane. Each of the imaging elements 1C1 to 1C9 includes an imaging lens 25 provided on the front surface 17S of transparent layer 17 instead of the moth eye structure 21. Here, one imaging lens 25 is provided common to a plurality of pixels 22 in each of the imaging elements 1C1 to 1C9. The imaging lens 25 provides a refractive power to the light L (L1 to L9) toward the resonator structure 10C. It is to be noted that the shapes and refractive powers of the imaging lenses 25 in the imaging elements 1C1 to 1C9 may be the same as or different from each other. Except for this point, the imaging element 1C (1C1 to 1C9) has substantially the same configuration as the imaging element 1 according to the first embodiment described above.

The resonator structures 10C in the imaging elements 1C1 to 1C9 respectively allow the light L having different peak wavelengths, that is, lights L1 to L9 having wavelengths λ1 to λ9 to be selectively transmitted therethrough. Accordingly, the imaging elements 1C1 to 1C9 selectively obtain the lights L1 to L9 having the wavelengths λ1 to λ9, respectively.

[Workings and Effects of Camera Module 2]

As described above, the camera module 2 includes a plurality of imaging elements 1C1 to 1C9 that obtain respective different wavelengths. As described in the first embodiment described above, each of the imaging elements 1C1 to 1C9 has a simple structure including a relatively small number of layers, which makes it possible to achieve simplification and thinning of the camera module 2 as a whole. This makes it possible to manufacture the camera module 2 by a simple manufacturing process, which contributes to mass production. In addition, a highly accurate optical spectrum is obtained in the resonator structure 10C, thereby also improving imaging performance in the camera module 2.

4. Application Examples of Imaging Device

Next, applications to which the imaging element 1 is applicable are described with reference to FIGS. 15 and 16.

[4.1 Application Example to Monitoring of Growth State of Agricultural Crops, Etc.]

It is possible to use the imaging element 1 in a spectroscopic device that performs multispectral dispersion or hyperspectral dispersion for measurement of a normalized differential vegetation index (NDVI: Normalized Difference Vegetation Index) for growth of agricultural crops and plants (hereinafter, referred to as plants and the like). FIG. 15 illustrates spectral characteristics of reflectance depending on a growth state of the plants and the like.

As illustrated in FIG. 15, in a wavelength range from 600 nm to 800 nm, the plants and the like have a different reflectance distribution depending on the growth state thereof. That is, the reflectance distribution different depending on whether the plants and the like are healthy, weak, or dead is illustrated. This reflectance distribution is formed by reflected light mainly on leaves of the plants and the like. It is possible from the results of the reflectance distribution in FIG. 15 that obtaining spectral characteristics of two or more lights from the plants and the like at least in a wavelength band including wavelengths from 600 nm to 800 nm makes it possible to sense the growth state (vegetation state) of the plants and the like.

It is possible to sense the vegetation state from a relationship between two signal values with use of, for example, two imaging elements, that is, the imaging element 1 able to detect a wavelength band in a wavelength range of 600 nm to 700 nm, and another imaging element 1 able to detect a wavelength band in a wavelength range of 700 nm to 800 nm. Alternatively, to improve detection accuracy, three or more imaging elements 1 may be used to detect three or more plural wavelength bands and sense the vegetation state from a relationship among signal values of these wavelength bands.

The imaging element 1 able to detect such a wavelength band is mounted on, for example, a small unmanned aerial vehicle (a so-called drone), which makes it possible to monitor the growth state of agricultural crops from the sky, and manage and control growth of the crops.

[4.2 Application Example to Biometric Authentication]

It is possible to use the imaging element 1, for example, in a spectroscopic device that performs multispectral dispersion or hyperspectral dispersion to measure reflectance of human skin in biometric authentication. In the multispectral dispersoin or hyperspectral dispersion, a plurality of spectral dispersions is performed in multiple bands of three or more primary colors of light. FIG. 16 illustrates optical spectrum characteristics of reflectance of human skin.

As illustrated in FIG. 16, it can be seen that the reflectance greatly changes particularly in a wavelength range of 450 nm to 650 nm. These changes make it possible to authenticate whether or not a subject is human skin.

For example, detecting three spectra of a wavelength of 450 nm, a wavelength of 550 nm, and a wavelength of 650 nm with use of three imaging elements 1 makes it possible to authenticate whether or not the subject is human skin. For example, in a case where the subject is a material other than human skin, the spectral characteristics of the reflectance are changed, which makes it possible to distinguish the material from human skin.

Accordingly, the imaging element 1 able to detect such a wavelength band is mounted on, for example, a biometric authentication device, which makes it possible to apply the imaging element 1 to prevention of forgery of faces, fingerprints, irises, and the like, thereby enabling more accurate biometric authentication.

[4.3 Application Example to Electronic Apparatus]

The imaging element 1 as described above is applicable to various kinds of electronic apparatuses. Examples of the electronic apparatuses include an imaging system such as a digital still camera and a digital video camera, a mobile phone having an imaging function, and other apparatuses having imaging functions.

FIG. 17 is a block diagram illustrating a configuration example of an imaging device 101 mounted on an electronic apparatus. As illustrated in FIG. 17, the imaging device 101 includes an optical system 102, an imaging element 103, a signal processing circuit 104, a monitor 105, and a memory 106, and is able to capture a still image and a moving image.

The optical system 102 includes one or a plurality of lenses, and guides image light (incident light) from a subject to the imaging element 103, and forms an image on a light reception surface (a sensor section) of the imaging element 103.

The imaging element 1 described above is applied as the imaging element 103. Electrons are accumulated in the imaging element 103 for a fixed period of time in accordance with the image formed on the light reception surface via the optical system 102. Thereafter, a signal corresponding to the electrons accumulated in the imaging element 103 is supplied to the signal processing circuit 104.

The signal processing circuit 104 performs various kinds of signal processing on a pixel signal outputted from the imaging element 103. An image (image data) captured by performing signal processing by the signal processing circuit 104 is supplied to and displayed on the monitor 105, or is supplied to and stored (recorded) in the memory 106.

In the imaging device 101 configured in such a manner, applying the imaging element 1 described above makes it possible to obtain a highly accurate optical spectrum while having a simple structure. This makes it possible to cature an image with higher image quality.

5. Example of Practical Application to Endoscopic Surgery System

The technology (present technology) according to the present disclosure is applicable to various products. For example, the technology according to the present disclosure may be applied to an endoscopic surgery system.

FIG. 18 is a view depicting an example of a schematic configuration of an endoscopic surgery system to which the technology according to an embodiment of the present disclosure (present technology) can be applied.

In FIG. 18, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 19 is a block diagram depicting an example of a functional configuration of the camera head 11102 and the CCU 11201 depicted in FIG. 18.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure may be applied has been described above. The technology according to the present disclosure may be applied to (the image pickup unit 11402 of) the camera head 11102, (the image processing unit 11412 of) the CCU 11201, and the like) among the components described above. Specifically, for example, the imaging element 1 is applicable to the image pickup unit 10402. Applying the technology according to the present disclosure to the image pickup unit 10402 makes it possible to capture a more accurate image of a surgical region, which allows a surgeon to reliably confirm the surgical region.

It is to be noted that the endoscopic surgery system has been described here as one example, but the technology according to the present disclosure may be additionally applied to, for example, a microscopic surgery system or the like.

6. Example of Practical Application to In-Vivo Information Acquisition System FIG. 20 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 20, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

One example of the in-vivo information acquisition system to which the technology according to the present disclosure may be applied has been described above. The technology according to the present disclosure may be applied, for example, to the image pickup unit 10112 among the components described above. Specifically, the imaging element 1 in FIG. 1 is applicable to the image pickup unit 10112. Applying the technology according to the present disclosure to the image pickup unit 10112 makes it possible to acquire a more accurate image of the surgical region, thereby improving inspection accuracy.

7. Example of Practical Application to Mobile Body

For example, the technology (the present technology) according to the present disclosure may be achieved as a device mounted on any type of mobile body such as a vehicle, an electric vehicle, a hybrid electric vehicle, a motorcycle, a bicycle, a personal mobility, an airplane, a drone, a vessel, or a robot.

FIG. 21 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display and a head-up display.

FIG. 22 is a diagram depicting an example of the installation position of the imaging section 12031.

In FIG. 22, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure may be applied has been described above. The technology according to the present disclosure may be applied to the imaging section 12031 among the components described above. Specifically, the imaging element 1 in FIG. 1 is applicable to the imaging section 12031. Applying the technology according to the present disclosure to the imaging section 12031 makes it possible to obtain a captured image that is easier to see. Hence, it is possible to reduce fatigue of the driver.

8. Other Modification Examples

The present disclosure has been described above with reference to some embodiments and modification examples; however, the present disclosure is not limited to the embodiments and the like described above, and may be modified in a variety of ways. For example, in the imaging elements 1 and 1A according to the first embodiment described above, a case where the first resonator 13 or 13A has a three-layer structure or a four-layer structure is described as an example; however, the present disclosure is not limited thereto, and the number of stacked layers in the first resonator is optionally settable. In addition, the materials and thicknesses of the respective layers of the resonator structure are not limited to those described above, and are optionally settable.

In addition, the imaging elements 1 and 1A according to the first embodiment described above, the moth eye structure 21 is provided on the front surface 17S of the transparent layer 17; however, the present disclosure is not limited thereto. For example, as with an imaging element 1D according to a third modification example of the first embodiment illustrated in FIG. 23, an on-chip lens 26 may be provided for each of the pixels 22 on the front surface 17S of the transparent layer 17.

In addition, in the imaging elements 1C1 to 1C9 according to the second embodiment described above, the imaging lens 25 is provided on the front surface 17S of the transparent layer 17; however, the present disclosure is not limited thereto. For example, as with an imaging element 1E according to a first modification example of the second embodiment illustrated in FIG. 24, a space may be provided between the front surface 17S of the transparent layer 17 and the imaging lens 25. The imaging element 1E further includes the moth eye structure 21 on the front surface 17S.

Alternatively, instead of the moth eye structure 21, an on-chip lens may be provided on the front surface 17S.

It is to be noted that the effects described in the present specification are merely illustrative and non-limiting, and there may be other effects. In addition, the present technology may have the following configurations.

(1)

A resonator structure comprising:

a stacked structure that includes a semiconductor layer, a first resonator, a first reflection layer, a second resonator, a second reflection layer stacked in this order, allows light of a specific wavelength band to be transmitted therethrough, the semiconductor layer having a first average refractive index, the first resonator having a second average refractive index lower than the first average refractive index, and the first reflection layer having a third average refractive index higher than the second average refractive index.

(2)

The resonator structure according to (1), in which the second average refractive index is 1 or more and four or less.

(3)

The resonator structure according to (1), in which the second average refraction index is 1 or more and two or less.

(4)

The resonator structure according to any one of (1) to (3), in which the second resonator has a refractive index distribution in a stacked plane.

(5)

The resonator structure according to (4), in which the second resonator includes a first portion having a first refractive index, and a second portion being dispersedly located in the first portion in the stacked plane and having a second refractive index.

(6)

The resonator structure according to any one of (1) to (5), in which a thickness of the first resonator is 400 nm or less.

(7)

The resonator structure according to any one of (1) to (6), in which the first reflection layer and the second reflection layer include a material including polycrystal silicon.

(8)

The resonator structure according to (7), in which each of a thickness of the first reflection layer and a thickness of the second reflection layer is 50 nm or less.

(9)

The resonator structure according to any one of (1) to (8), in which the first reflection layer and the second reflection layer includes a material including polycrystal silicon, and except for the first reflection layer, the second reflection layer, and the semiconductor layer, others include a material other than elemental silicon.

(10)

The resonator structure according to (9), in which each of thicknesses of the first reflection layer and the second reflection layer is 50 nm or less.

(11)

The resonator structure according to any one of (1) to (10), further including a visible light cut filter that suppresses transmission of visible light.

(12)

The resonator structure according to any one of (1) to (11), in which the first resonator includes a multilayer film structure in which a plurality of films is stacked.

The resonator structure according to claim 1.

(13)

The resonator structure according to (12), in which the plurality of films in the first resonator includes a material containing at least one kind of silicon oxide, silicon nitride, tantalum oxide, or aluminum oxide.

(14)

An imaging element comprising:

a plurality of pixels each including a photoelectric converter and a resonator structure that allows light of a specific wavelength band to be transmitted toward the photoelectric converter, the resonator structure including a semiconductor substrate, a first resonator, a first reflection layer, a second resonator, a second reflection layer stacked in this order, the semiconductor substrate including the photoelectric layer and having a first average refractive index, the first resonator having a second average refractive index lower than the first average refractive index, and the first reflection layer having a third average refractive index higher than the second average refractive index.

(15)

The imaging element according to (14), further including a light shielding layer between adjacent ones of the plurality of pixels.

(16)

The imaging element according to (14) or (15), in which the plurality of pixels is provided with a lens that provides refractive power to light L toward the resonator structure, and the respective resonator structures in the plurality of pixels allow light of wavelength bands different from each other to be transmitted therethrough.

(17)

An electronic apparatus comprising:

an imaging element, the imaging element including a plurality of pixels each including a photoelectric converter and a resonator structure that allows light of a specific wavelength band to be transmitted toward the photoelectric converter, the resonator structure including a semiconductor substrate, a first resonator, a first reflection layer, a second resonator, a second reflection layer stacked in this order, the semiconductor substrate including the photoelectric layer and having a first average refractive index, the first resonator having a second average refractive index lower than the first average refractive index, and the first reflection layer having a third average refractive index higher than the second average refractive index.

This application claims the benefit of Japanese Priority Patent Application JP2018-96234 filed with the Japan Patent Office on May 18, 2018, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A resonator structure, comprising:

a stacked structure that includes a semiconductor layer, a first resonator, a first reflection layer, a second resonator, a second reflection layer stacked in this order, wherein a thickness of the first resonator is less than or equal to 400 nm, the stacked structure allows transmission of light of a specific wavelength band, the semiconductor layer has a first average refractive index, the first resonator has a second average refractive index lower than the first average refractive index, and the first reflection layer has a third average refractive index higher than the second average refractive index.

2. The resonator structure according to claim 1, wherein the second average refractive index is 1 or more and four or less.

3. The resonator structure according to claim 1, wherein the second average refractive index is 1 or more and two or less.

4. The resonator structure according to claim 1, wherein the second resonator has a refractive index distribution in a stacked plane.

5. The resonator structure according to claim 4, wherein the second resonator includes:

a first portion that has a first refractive index, and a second portion that is dispersed located in the first portion in the stacked plane, wherein the second portion has a second refractive index.

6. The resonator structure according to claim 1, wherein the first reflection layer and the second reflection layer include a material including polycrystal silicon.

7. The resonator structure according to claim 6, wherein each of a thickness of the first reflection layer and a thickness of the second reflection layer is 50 nm or less.

8. The resonator structure according to claim 1, wherein the first reflection layer and the second reflection layer include a material including polycrystal silicon, and the first resonator and the second resonator include a material other than different from elemental silicon.

9. The resonator structure according to claim 8, wherein a thickness of each of the first reflection layer and the second reflection layer is 50 nm or less.

10. The resonator structure according to claim 1, further comprising a visible light cut filter that suppresses transmission of visible light.

11. The resonator structure according to claim 1, wherein the first resonator includes a multilayer film structure in which a plurality of films is stacked.

12. The resonator structure according to claim 11, wherein the plurality of films includes a material that includes at least one of silicon oxide, silicon nitride, tantalum oxide, or aluminum oxide.

* * * * *